United States Patent [19]
Sato et al.

[11] Patent Number: 5,654,916
[45] Date of Patent: Aug. 5, 1997

[54] SEMICONDUCTOR MEMORY DEVICE HAVING AN IMPROVED SENSE AMPLIFIER ARRANGEMENT

[75] Inventors: Hiroshi Sato; Keiichi Yoshida, both of Ohme; Tetsuya Tsujikawa, Hamura, all of Japan

[73] Assignee: Hitachi, Ltd., Tokyo, Japan

[21] Appl. No.: 510,465

[22] Filed: Aug. 2, 1995

Related U.S. Application Data

[63] Continuation of Ser. No. 273,170, Jul. 26, 1994.

[30] Foreign Application Priority Data

Jul. 26, 1993 [JP] Japan ............................ 5-203570

[51] Int. Cl.$^6$ .................................................. G11C 7/00
[52] U.S. Cl. ................... 365/185.06; 365/103; 365/104; 365/230.02; 365/189.02; 365/94
[58] Field of Search ........................ 365/185.06, 94, 365/103, 104, 219, 221, 230.03, 230.02, 189.02

[56] References Cited

U.S. PATENT DOCUMENTS

| 4,903,235 | 2/1990 | Kubota et al. | 365/104 |
|---|---|---|---|
| 5,051,954 | 9/1991 | Toda et al. | 365/230.03 |
| 5,289,413 | 2/1994 | Tsuchida et al. | 365/221 |
| 5,394,371 | 2/1995 | Hotta | 365/94 |

*Primary Examiner*—David C. Nelms
*Assistant Examiner*—Vu A. Le
*Attorney, Agent, or Firm*—Antonelli, Terry, Stout & Kraus, LLP

[57] ABSTRACT

A semiconductor memory device in which a plurality of data lines of a memory array comprising storage transistors arranged in a matrix form as those having a high or low threshold voltage according to stored data are divided into a plurality of blocks, and sense amplifiers for performing amplification operations dispersedly in time are used to amplify signals. Moreover, a first and a second group of sense amplifiers corresponding to odd- and even-numbered adjoining data lines are arranged so that while the output signals of one group of sense amplifiers are output, word lines are switched, and the other group of sense amplifiers are caused to perform the operation of amplifying the signals read from the memory cells corresponding to the word lines thus switched, respectively.

33 Claims, 25 Drawing Sheets

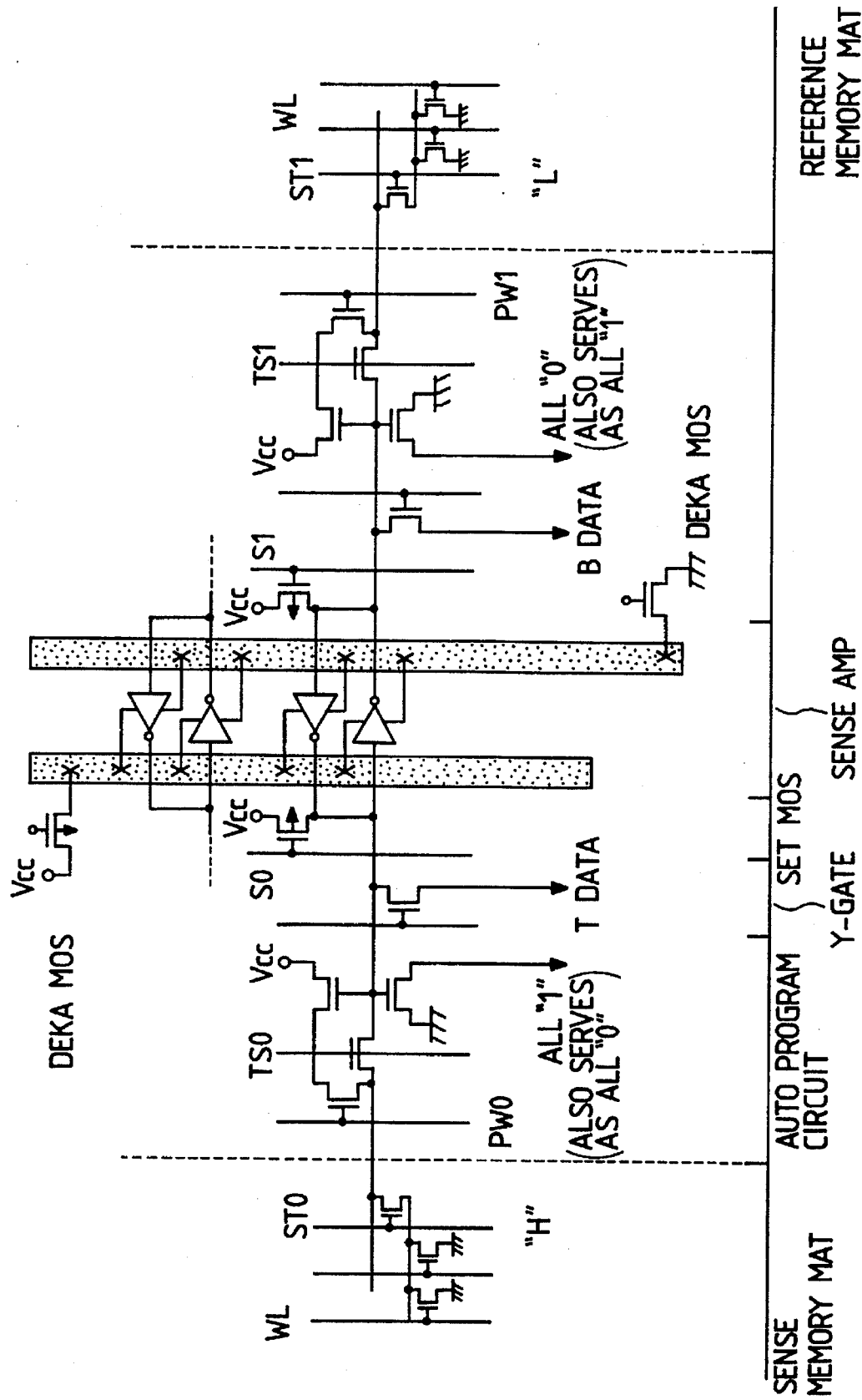

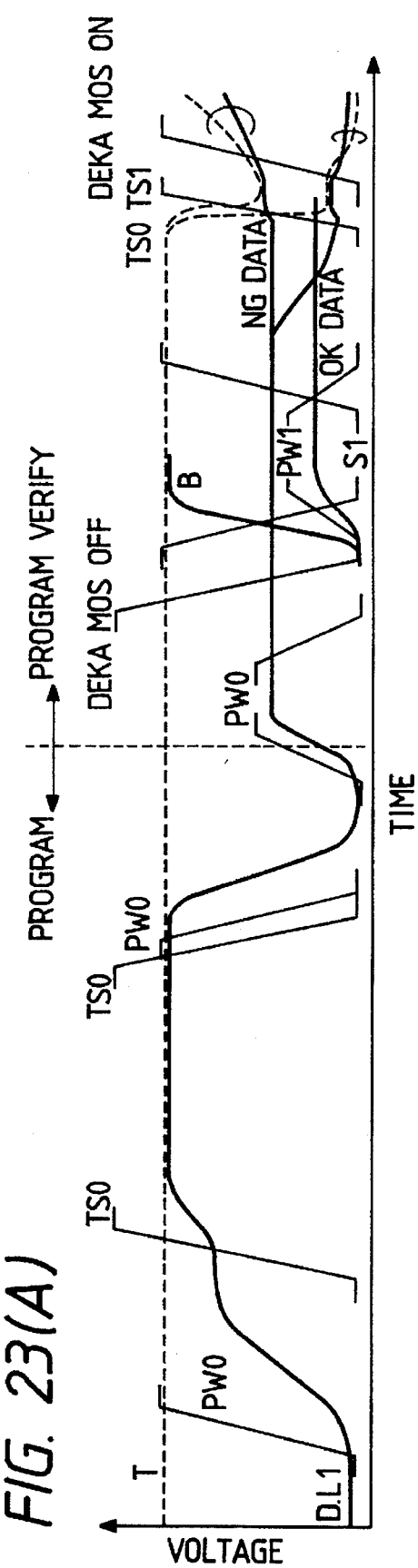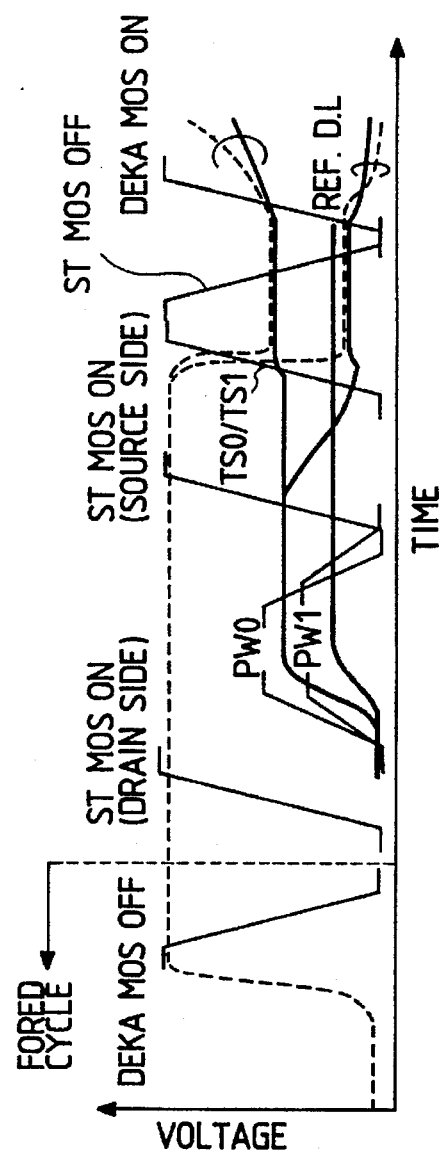

SEMICONDUCTOR MEMORY DEVICE HAVING AN IMPROVED SENSE AMPLIFIER ARRANGEMENT

This is a continuation of application Ser. No. 08/273,170, filed Jul. 26, 1994.

BACKGROUND OF THE INVENTION

The present invention relates to a semiconductor memory device and more particularly to, for example, technology effectively utilizable in reading batch EEPROM (Electrically Erasable & Programmable Read Only Memory) at high speed.

SUMMARY OF THE INVENTION

Batch EEPROMs are nonvolatile storage devices which function as those operating to erase all the memory cells formed on a chip or a certain group of memory cells among the memory cells formed on the chip electrically and collectively.

Such batch EEPROMs were referred to in the IEEE INTERNATIONAL SOLID-STATE CIRCUITS CONFERENCE, 1980, pp 152–153; the IEEE INTERNATIONAL SOLID-STATE CIRCUITS CONFERENCE, 1987, pp 76–77; and the IEEE J. Solid-State Circuits, vol. 23(1988) pp 1157–1163.

FIG. 27 is a sectional structural view of a batch EEPROM cell announced at the International Electron Device Meeting, 1987. The memory cell is quite similar instructure to any ordinary memory cell; in other words, it comprises an insulated gate field effect transistor in double-layer gate structure (hereinafter called MOSFET or simply transistor). In FIG. 27, reference numeral 8 denotes a P-type silicon substrate, 11 a P-type diffusion layer formed on the silicon substrate 8, 10 a low-density N-type diffusion layer formed on the silicon substrate 8, and 9 N-type diffusion layers respectively formed on the P- and N-type diffusion layers 11, 10. Further, a reference numeral 4 denotes a floating gate formed on a thin oxide film 7 via the P-type silicon substrate 8, 6 a control gate formed on the floating gate 4 via the oxide film 7, 3 a drain electrode, and 5 a source electrode. In other words, the memory cell of FIG. 27 is formed with MOSFET in N-channel double-layer gate structure and data are stored in this transistor, the data being actually stored in the transistor as variations in the threshold voltage.

Unless otherwise specified, a description will subsequently be given of a case where the transistor (hereinafter called the transistor) for storing data is of an N-channel type. The operating of programming data to the memory cell shown in FIG. 27 is similar to that of EPROM. In other words, the program operation is performed by infecting the hot carriers generated near the drain region 9 connected to the drain electrode 3 into the floating gate 4. Because of the program operation, the threshold voltage of the storage transistor as viewed from the control gate 6 becomes higher than that of what is set free from undergoing the program operation.

During the erase operation, on the other hand, a high electric field is produced between the floating gate 4 and the source region 9 connected to the source electrode 5 by applying a high voltage to the source electrode 5. The electrons stored in the floating gate 4 by utilizing the tunnel phenomenon via the thin oxide film 7 are pulled via the source region 9 into the source electrode 5. Consequently, the stored data is erased. In other words, the erase operation makes lower the threshold voltage of the storage transistor as viewed from the control gate 6.

During the read operation, the voltage applied to the drain electrode 3 and the control gate 6 is limited to a relatively small value in order to prevent weak programming to the memory cell, that is, to prevent undesired carriers from being injected into the floating gates 4. For example, a voltage of as low as 1 V is applied to the drain electrode 3 and a voltage of as low as 5 V is applied to the control gate 6. These voltages are applied to detect the size of the channel current flowing through the storage transistor and to decide whether the data stored in the memory cell is "0" or "1".

Read operation resulting from the storage transistor above is performed with a memory cycle of as slow as about 1s. The present inventors turned particular attention to the fact that while data was being output, the following address may be input, and considered to have data serially read out continuously at high speed.

An object of the present invention is to provide a semiconductor memory device capable of serially reading data at high speed and reducing the peak current.

Another object of the present invention is to provide a semiconductor memory device capable of lessening the adjoining data-line to data-line coupling effect.

These and other objects and novel features of the present invention will become more apparent by referring to the following description and appended drawings.

The objects of the present invention can be accomplished as follows: a semiconductor memory device in which a plurality of data lines of a memory array comprising storage transistors arranged in a matrix form as those having a high or low threshold voltage according to stored data are divided into a plurality of blocks, and sense amplifiers for performing amplification operations dispersedly in time are used to amplify signals Moreover, a first and a second group of sense amplifiers corresponding to odd- and even-numbered adjoining data lines are arranged so that while the output signals of one group of sense amplifiers are output, word lines are switched, and the other group of sense amplifiers are caused to perform the operation of amplifying the signals read from the memory cells corresponding to the word lines thus switched, respectively.

With the aforesaid semiconductor memory device, the peak current is reducible as the sense amplifiers perform dispersedly in time and by performing the operation of reading odd- and even-numbered data lines alternately, adjoining data-line to data-line coupling noise can be reduced and a continuous serial high-speed operation can also be carried out effectively.

BRIEF DESCRIPTION OF THE DRAWINGS

FIG. 22 is still another circuit diagram illustrating the relation between the data line and differential sense amplifier of the semiconductor memory device according to the present invention.

FIGS. 23(A) and 23(B) are waveform charts illustrating an example of the operation of the circuit of FIG. 22.

DESCRIPTION OF THE PREFERRED EMBODIMENTS

Figure 1:
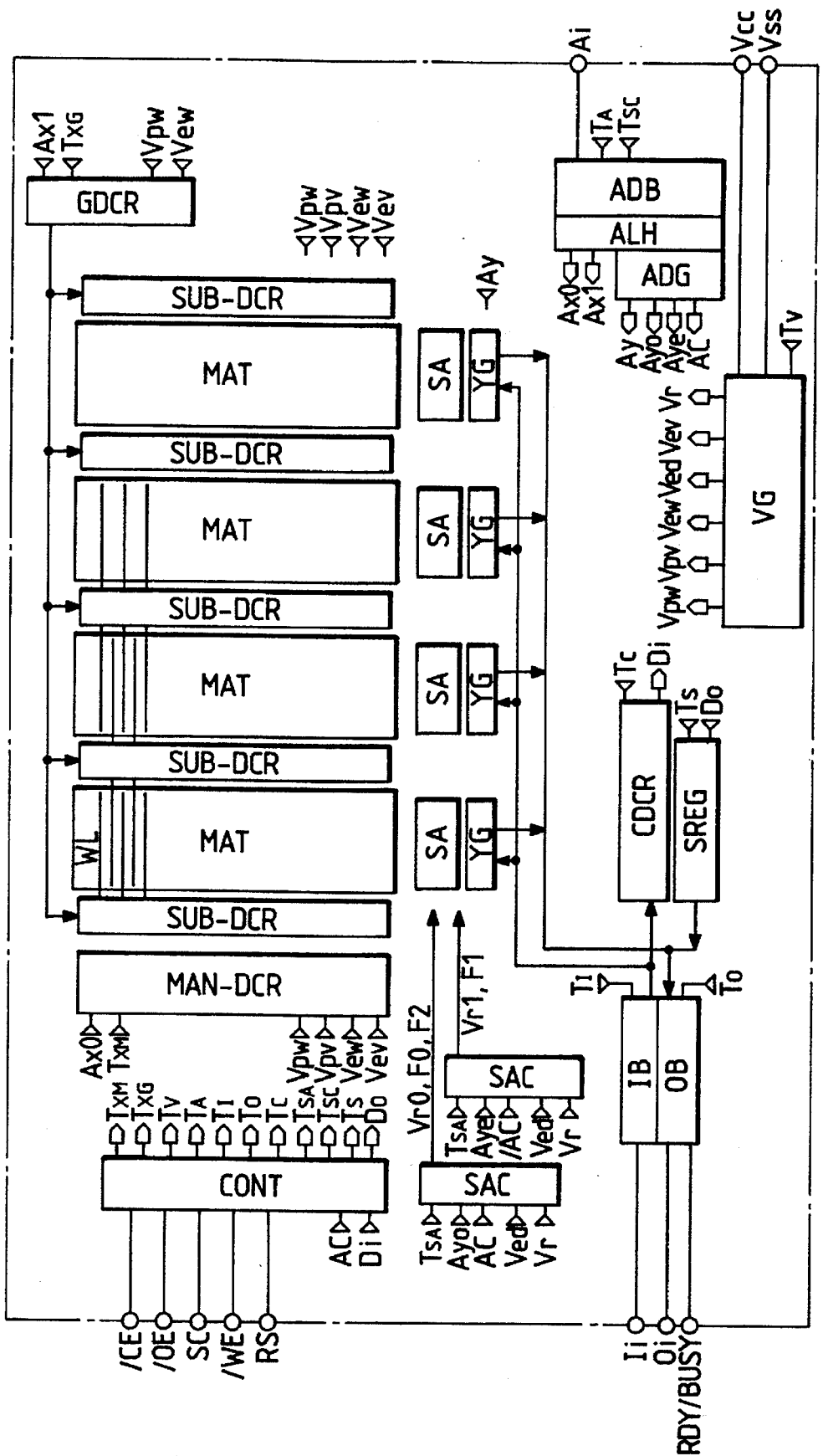
FIG. 1 is a block diagram of a batch EEPROM embodying the present invention.

FIG. 1 is a block diagram of a batch EEPROM embodying the present invention. Any known semiconductor integrated circuit technology is used for forming each of the circuit blocks shown in FIG. 1 on one semiconductor substrate of, though not necessarily limited to, monocrystalline silicon.

According to this embodiment, a memory array comprises, though not necessarily limited to, four memory mats MATs. Each memory mat is provided with subdecoders SUB-DCR for forming word line WL select signals. As the word-line to word-line pitch is set narrow for the purpose of integration, the subdecoder SUB-DCR held between the memory mats MATs forms the word line select signals for the memory mats MATs on both sides. As illustratively shown, the word lines of the memory mat MAT are alternately connected to two of the subdecoders SUB-DCR sandwiching the memory mat MAT therebetween.

A main decoder MAN-DCR is formed of, as will become apparent later, a circuit for forming a signal for selecting a select MOSFET for selecting a plurality of memory cells, and setting the select and non-select levels of the subdecoder SUB-DCR. A gate decoder GDCR forms a signal for selecting one memory cell in one memory block selected by the main decoder MAN-DCR.

Figure 27:
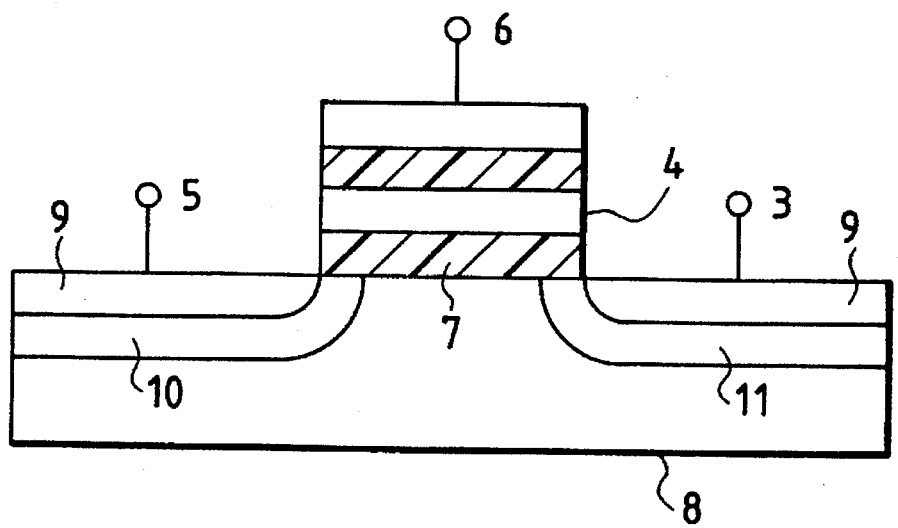
FIG. 27 is a schematic sectional view of an example of a conventional memory cell.

A storage transistor formed in the memory mat MAT performs, though not necessarily limited to, erase and program operations simultaneously with injecting electrical charge into a floating gate and causing it to emit the charge therefrom by means of a tunnel current. In addition, the storage transistor may perform an erase operation using the tunnel current as shown in FIG. 27.

Sense amplifiers SA are divided into, though not necessarily limited to, two groups as will become apparent later, and the amplification operation of each sense amplifier SA is controlled by a sense amplifier control circuit SAC. The following arrangement is made, though it is not necessarily restrictive: the two groups of sense amplifiers are both activated in the initial read cycle and at the time of continuous read accompanied with the switching of the word-line hereafter, the switching of the word line is conducted during l the time a serial signal is supplied from the other Group of sense amplifiers SA after a read signal from one group of sense amplifiers is terminated, and the amplification operation of the one group of sense amplifiers is started.

The sense amplifier SA has a latch function and is cut apart from a data line on receiving the read signal necessary for the amplification operation from the data line so as to amplify the received signal and hold the amplified one. Therefore, the signal selected by a Y-Gate circuit YG caused to be output via a data output buffer OB. In parallel to the signal output operation like this, the switching of the word line corresponding to the next address can be conducted as noted previously.

A status register SREG receives status data by means of a signal TS and monitors, if necessary, the operating l status from the outside via the data output buffer OB. According l to the present invention, continuous access operations and the aforementioned program/erase operations are performed. The status register SREG is provided because it is needed to know the internal status from the outside in the course of each operation.

A voltage Generator circuit VG functions as a DC—DC converter for providing various voltages Vpw, Vpv, Vew, Ved, Vev and Vr essential to the respective program, read and erase operations in response to a control signal TV on receiving a power supply voltage VCC of 5 V, for example, and the Ground potential VSS of the circuit.

An address buffer ADB fetches an address signal Ai supplied from an external terminal and makes an address latch ALH hold the address signal. An signal TA is a control signal for causing the address signal to be latched and a signal TSC an internal serial clock signal.

An address generator circuit ADG performs an address stepping action in response to the internal serial clock signal TSC generated in synchronization with a clock signal SC supplied from the outside and generates an address signal Ayo for activating the sense amplifiers SA corresponding to the odd-numbered data lines, an address signal Aye for activating the sense amplifiers SA corresponding to the even-numbered data lines, and a word-line switching signal AC. In other words, the address signal for subsequent continuous access is generated internally in accordance with the clock signal SC supplied from the external terminal only by inputting the designated start address in the semiconductor memory device according to this embodiment. The aforesaid signals Ayo and Aye, AC and AC are supplied to the sense amplifier control circuits SAC. The ∠ attached to the signal AC means that it is a bar signal whose low level is an active level; this applies to the other signals.

The Y-Gate YG forms a signal for selecting one data line during the read operation in response to an address signal Ay in Y series, selects the signal for amplifying the corresponding sense amplifier and transmits the amplification signal to the data output buffer OB. The Y-Gate YG also forms a signal for selecting one data line during the program operation and transmits to the data line a signal corresponding to the program data supplied from a data input buffer IB.

A command decoder CDCR decodes the command supplied from the data input buffer IB and transmits command data Di to a control circuit CONT as will subsequently be explained. A signal TC is a command decoder control signal for retrieving commands and controlling the decoder.

On receiving a chip enable signal /CE, an output enable signal /OE, a write enable signal /WE, the clock signal SC and a reset signal RS, the control circuit CONT forms various timing signals necessary for the operation of the internal circuit. A signal XM is a main decoder control signal for the switching of the positive/negative logic at the time of program-program verify; a signal TXG a Gate decoder control signal; a signal TV a power supply circuit control signal; a signal TA an address buffer control signal for controlling address latching; and a signal TI a data input buffer control signal for controlling the retrieval of data and commands.

A signal TO is a data output buffer control signal for controlling output data; a signal TC a command decoder control signal for retrieving commands and controlling the decoder; a signal TS a status register control signal for controlling the setting or resetting of the status register SREG; a signal TSA a sense amplifier control signal for controlling activation timing; a signal TSC an internal serial clock signal; and a signal AC a word-line switching signal.

In addition, a signal Axo supplied from the address latch ALH to the main decoder MAN-DCR is an address signal in X series for designating a memory. block to be selected; a signal Ax1 supplied from the address latch ALH to the gate decoder GDCR is an address signal in X series for designating one word line within one memory block; and a signal Ay supplied to the Y-gate YG is an address signal in Y series.

The voltage Vpw is a word line voltage at the time of program; Vpv a word line voltage at the time of verify; Vew a word line voltage at the time of erasure; Ved a data line voltage at the time of erasure; and Vr a data-line precharge voltage.

A signal Oi is output data from the data output buffer OB; a signal Do is status data; and a signal Di is command data. In addition, a signal RDY/BUSY is a signal for outputting the chip condition.

Figure 28:
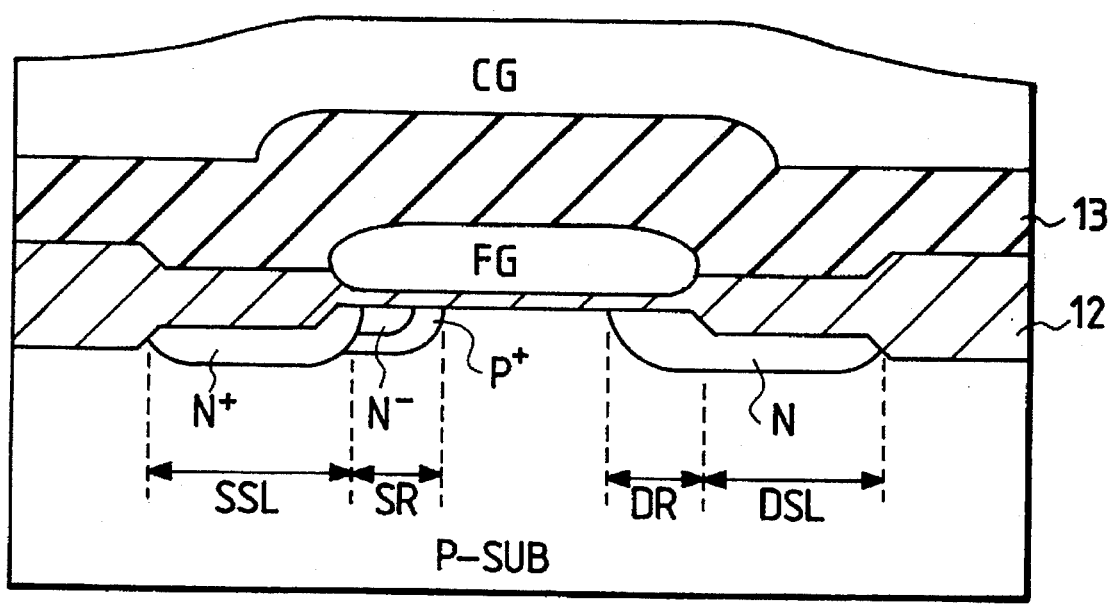
FIG. 28 is a schematic sectional view of another example of the memory cell.

FIG. 28 is a schematic sectional view of another memory cell of the batch EEPROM.

In FIG. 28, P-Sub denotes a p-type silicon substrate; SSL a subsource line formed with an $n^{3G}$-type diffusion layer; SR a source region of the memory cell; DR a drain region of the memory cell; and DSL a subdata line formed with an n-type diffusion layer. The source region SR is formed with a p⁻ and an n⁺type diffusion layer, and the drain region DR is formed with an n-type diffusion layer like the subdata line DSL. The drain region DR is asymmetrical with respect to the source region. Further, FG denotes a floating gate formed on the p-type silicon substrate via an oxide film 12; and CG a control gate formed on the floating gate via an oxide film 13. The operations of programming and erasing data to and from the memory cell shown in FIG. 28 are performed using the tunnel phenomenon via the oxide film 12 between the floating gate FG and the drain region DR. During the erase operation, electrical charge is injected from the drain region DR to the floating gate FG and during the program operation, the charge thus injected into the floating gate FG is caused to be discharged from the drain region DR. With respect to the gate, source and drain voltages applied during the write and erase operations, refer to Table 1 to be described.

In this case, the gate voltage is applied to the control gate CG; the source voltage to the source region SR; and the drain voltage to the drain region DR.

Figure 2:
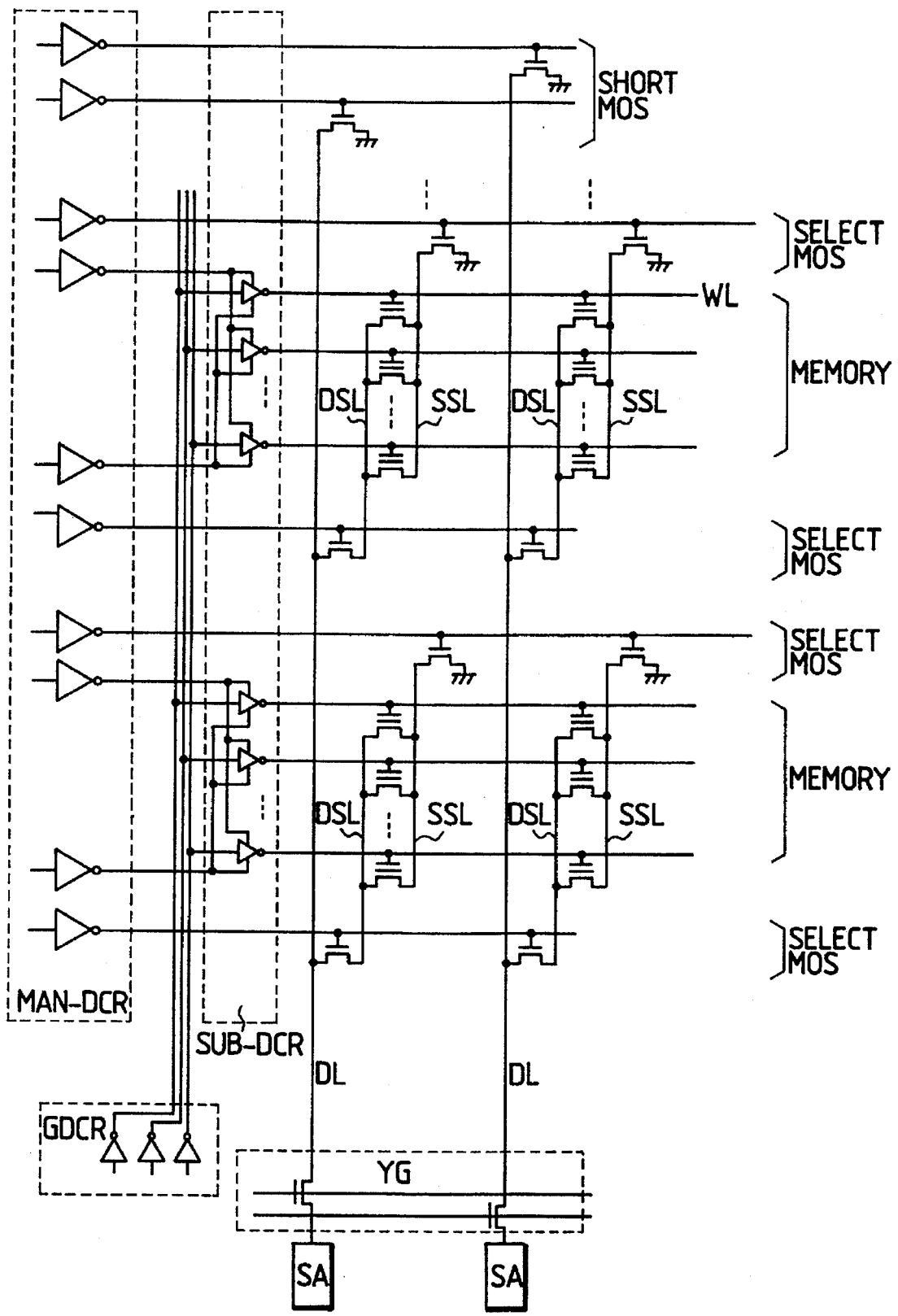
FIG. 2 is a schematic circuit diagram of the above memory mat and its peripherals.

FIG. 2 is a schematic circuit diagram of the aforesaid memory mat and its peripherals. The memory cell is a MOSFET in stacked gate structure of FIG. 28 or otherwise a MOSFET in stacked gate structure similar to what is shown in FIG. 27. According to this embodiment, both the program and erase operations are performed using the tunnel current via the thin oxide film.

A plurality of storage MOSFETs are combined into one block with their drains and sources adapted for common use. The common drains of the storage MOSFETs are connected to the data lines DL via the select MOSFETs. The common sources of the storage MOSFETs are supplied with the ground potential of the circuit via the select MOSFETs. The control gates of the storage MOSFETs are connected to the word lines WL. The select MOSFET is selected by the select line extended in parallel to the word line WL. In other words, the select MOSFET is regarded as a main word line to be selected by the main decoder MAN-DCR.

With the foregoing arrangement of memory cells divided into blocks, in each of which the ground potential of the circuit is supplied via the non-select MOSFET to the subdata line DSL and the subsource line SSL, the stress applied to the non-select memory cell can thus be reduced. In other words, there is provided a memory cell wherein the word line is selected, whereas the data line is set non-selective or wherein the word line is set non-selective, whereas the data line is made selective, whereby the write or erase voltage is prevented from being applied to the memory cell which should hold the data during the program or erase operation. As a result, the stress is applied to only a few memory cells within the block.

According to this embodiment, the adjoining data lines DL are divided into odd- and even-numbered ones, and a short MOSFET is provided correspondingly. The short MOSFET is made to select the odd- and even-numbered data lines alternately and by setting the non-selective data line DL at the fixed level of the ground potential of the circuit, used to reduce the mutual coupling noise between the adjoining data lines DL. In order to deal with the data lines DL thus arranged, the Y-gates YGs are also divided into odd-and even-numbered ones for selection with respect to the sense amplifiers SA for amplifying read signals appearing on the data lines DL. The Y-gate YG is, as will become apparent later, formed with a transfer MOSFET.

One memory cell within the block selected by the main decoder MAN-DCR is selected by the sub-decoder SUB-DCR, which selects one word line within the block. The one word-line select signal like this is formed by the gate decoder GDCR. In other words, the sub-decoder SUB-DCR forms the word-line select/non-select drive signal on receiving the select/non-select levels formed in accordance with the operating mode formed by the main decoder MAN-DCR.

TABLE 1

|  |  | read | program | erase |
|---|---|---|---|---|
| select | Vg | Vcc | −10 V | 12 V |
|  | Vd | 1 V | 4 V | −4 V |
|  | Vs | 0 V | open | −4 V |
| non-select | Vg | 0V/open | Vcc/0 V | 0V/0V |
|  | Vd | 1V/open | 0V/open | −4V/open |
|  | Vs | 0V/open | open/open | −4V/open |

The gate voltage (word line WL) Vg, drain voltage Vd and source voltage Vs of the storage MOSFET in each of the read, write (program) and erase modes are given as those shown in Table 1 above. In consideration of the relative potential relation between the gate and drain voltages Vg, Vd and the voltage Vs, the tunnel current is generated via a thin gate insulating film so as to inject electrical charge into the floating gate or to cause the floating gate to emit the charge, whereby the write and erase operations are performed by varying the threshold voltage. In Table 1, the two voltages divided with ∠ or the two kinds of status correspond to the select/non-select blocks at the time of non-select.

Figure 3:
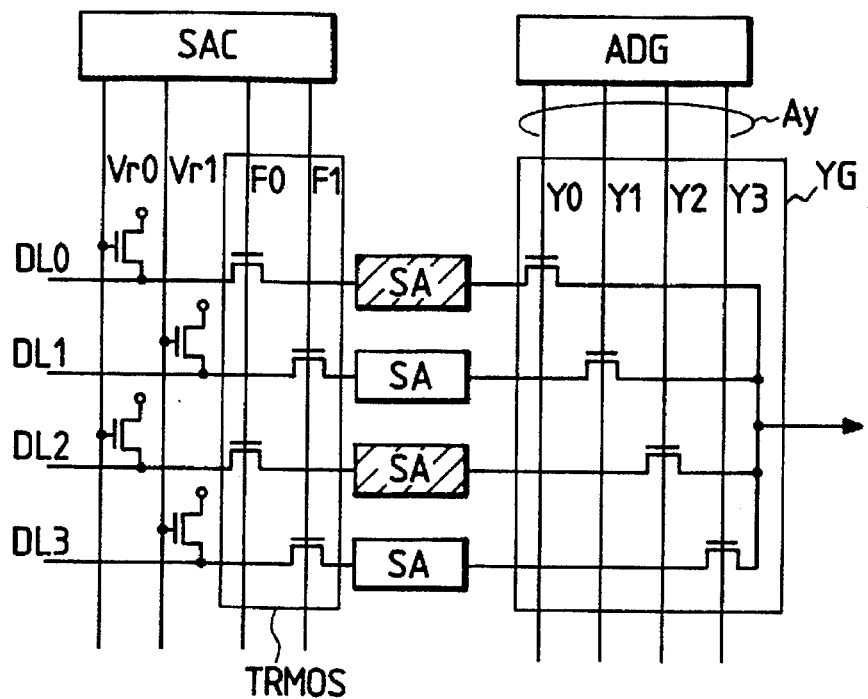
FIG. 3 is a circuit diagram illustrating the relation between the data lines and sense amplifiers of a semiconductor memory device according to the present invention.

FIG. 3 is a circuit diagram illustrating the relation between data lines and sense amplifiers according to the present invention. In FIG. 3, there are shown four data lines DL0–DL3 and corresponding four sense amplifiers SA by way of example. The data lines DL0–DL3 are divided into even-numbered data lines DL0, DL2 and odd-numbered data lines DL1, DL3. MOSFETs for receiving precharge voltage Vro are provided for the even-numbered data lines DL0, DL2, whereas MOSFETs for receiving precharge voltage Vrl are provided for the odd-numbered data lines DL1, DL3. In this way, precharging for the independent read operation becomes possible every even- and odd-numbered data line.

The even-numbered data lines DL0, DL2 are connected to the sense amplifiers SA via transfer MOSFETs (TRMOS) which are switch-controlled by a select signal F0, respectively. The odd-numbered data lines DL1, DL3 are connected to the sense amplifiers SA via transfer MOSFETs (TRMOS) which are switch-controlled by a select signal F1, respectively. The output signals of the sense amplifiers SA are supplied via the Y-gate YG switch-controlled by select signals Y0–Y3, respectively. In this way, the data lines of the memory mat or memory array are divided into two groups: odd- and even-numbered ones which may be caused to perform the respective time-distributed memory-cell read operations in response to the select signals F0, F1. The reason for the sense amplifiers SA and the data lines DL in one and the same memory mat MAT to be not activated at the same time is as follows:

By activating the even- and odd-numbered sense amplifiers SA alternately, signals from the memory cells can alternately be taken in and amplified. As shown by those with slanting lines of FIG. 3, for example, the word lines are switched from one to another in the sense amplifiers SA corresponding to the odd-numbered data lines DL1, DL3 that have completed their operation and read signals are taken out of the memory cells to be subsequently operated while the amplified read signals are being supplied from the sense amplifiers corresponding to the even-numbered data lines DL0, DL2.

When the sense amplifiers are divided into two groups and caused to perform the amplification operation dispersedly in time as noted above, the peak current accompanied with the amplification operation of the sense amplifier is broken up in time and thus substantially halved.

The read signals do not appear on the adjoining data lines simultaneously from the memory cells on the memory mat side. In other words, coupling noise can practically be obviated by the shield effect resulting from setting the inactive data line at a fixed level as in the case of the ground potential of the circuit by means of the short MOSFET of FIG. 2. A decrease in the coupling noise like this makes it possible to ignore the parasitic capacity between the data lines DL and therefore the data-line to data-line pitch can be made as narrow as possible. As a result, greater integration of memory arrays becomes feasible.

Instead of setting the inactive data line at the fixed level as in the case of the ground potential of the circuit by means of the short MOSFET, it may placed in a floating state. In this case, the parasitic capacity between the adjoining activated data lines DL is reduced by a large margin because of the provision of the data line DL in the floating state therebetween. Moreover, the presence of the parasitic capacity between the data line DL in the floating state and the ground potential of the circuit functions as what allows the noise component to escape toward the ground potential of the circuit and makes it practically possible to ignore the noise produced between the adjoining activated odd- or even-numbered data lines DL.

Figure 4:
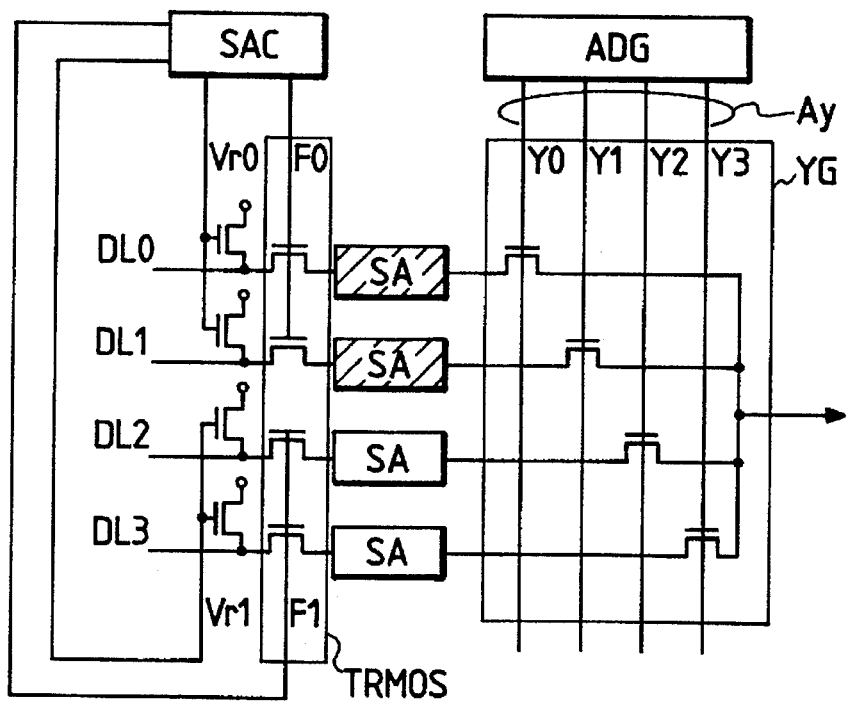
FIG. 4 is another circuit diagram illustrating the relation between the data lines and sense amplifiers of the semiconductor memory device according to the present invention.

FIG. 4 is another circuit diagram illustrating the relation between data lines and sense amplifiers according to the present invention. As shown in FIG. 4, MOSFETs for receiving the precharge voltages Vro and Vrl are provided for adjoining two groups of DL0, DL1 and DL2, DL3, respectively. In this way, precharging for the independent read operation becomes possible every two adjoining data lines.

The two data lines DL0, DL1 thus grouped are connected to respective sense amplifiers SA via transfer MOSFETs (TRMOS) which are switch-controlled by a select signal F0, whereas the remaining two data lines DL2, DL3 are connected to respective sense amplifiers SA via transfer MOSFETs (TRMOS) which are switch-controlled by a select signal F1. The output signals of the sense amplifiers SA are output via a Y-gate YG also switch-controlled by select signals Y0–Y3.

The arrangement above is basically similar to what is shown in FIG. 3 and unlike the data lines divided into odd-and even-numbered ones of FIG. 3, the adjoining two are grouped together. Even with this arrangement, it is possible to halve the peak current by activating the sense amplifiers and to gain access continuously at high speed with the switching of the word line. Since the data-line to data-line coupling takes place only between the two groups of data lines, moreover, the practical effect of noise is less than that of the coupling noise deriving from the adjoining left and right data lines.

Figure 5:
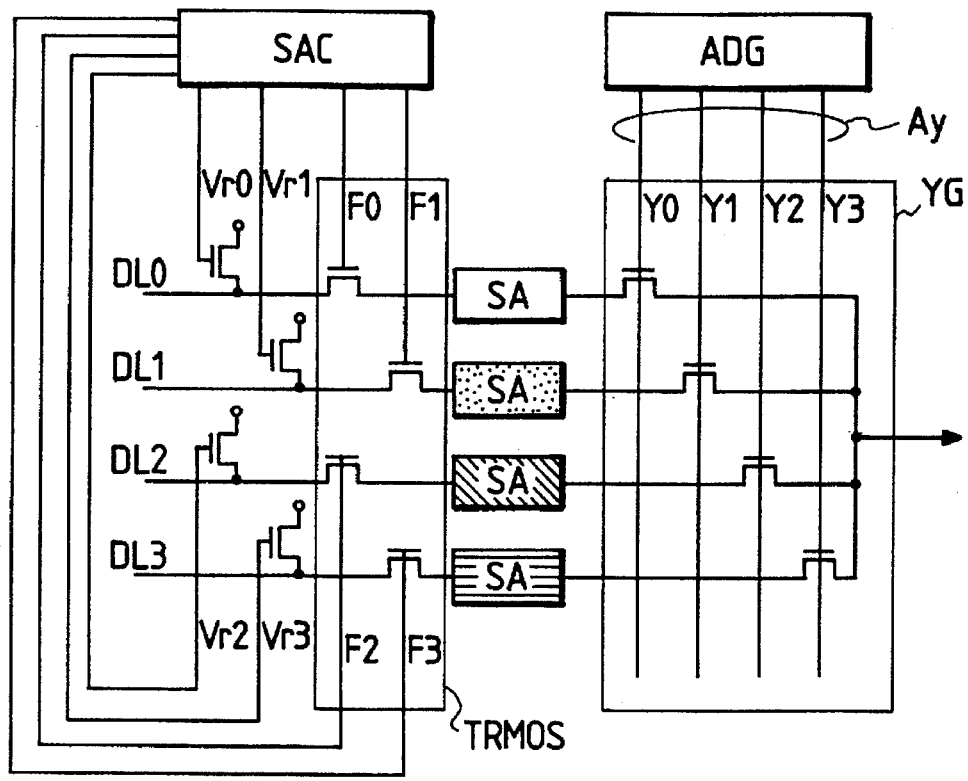
FIG. 5 is still another circuit diagram illustrating the relation between the data lines and sense amplifiers of the semiconductor memory device according to the present invention.

FIG. 5 is still another circuit diagram illustrating the relation between data lines and sense amplifiers according to the present invention. FIG. 5 refers to a case where the data lines are divided into four DL0~DL3. There are also provided four kinds of precharge voltages Vr0~Vr3 corresponding to the four data lines together with corresponding precharge MOSFETs. In this way, precharging for the independent read operation becomes possible every data line DL0~DL3 thereby.

The four data lines DL0~DL3 are connected to the sense amplifiers SA via transfer MOSFETs (TRMOS) which are switch-controlled by select signals F0~F3, respectively. The output signals of the sense amplifiers SA are output via a Y-gate YG also switch-controlled controlled by select signals Y0~Y3.

When the data lines are quartered as in the case of this embodiment, the select signals Y0~Y4 of the Y-gate YG and the select signals F0~F3 may be formed of the same address decode signal. With the data lines DL thus quartered, the peak current accompanied with the activation of the sense amplifiers is reducible further since the sense amplifiers can also be quartered at the same time. Even when the inactive date line is caused to remain in the floating state without supplying the fixed level, there exist three data lines in the floating state simultaneously between the active data lines, so that coupling noise can practically be obviated without the addition of a short MOSFET.

Figure 6:
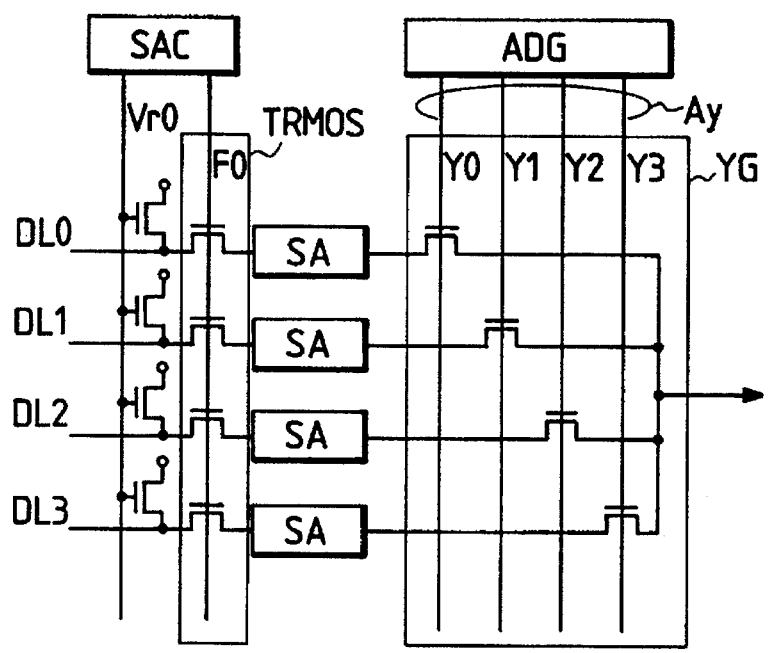
FIG. 6 is a circuit diagram of an example of data lines and that of sense amplifiers examined prior to the present invention.

Incidentally, the variations of the read signals from the memory cells are caused to affect each other by the precharge operations of the data lines DL0~DL3, the read operations of the memory cells and the parasitic capacity among the data lines DL0~DL3 resulting from the simultaneous operations of the sense amplifiers SA when the division of the data lines DL is not carried out as shown in FIG. 6. In the worst case, the potential of the data line DL1 is lowered by coupling when the adjoining data lines DL0, DL1 are both changed to have a low level at the time the data line DL1 should be kept at the precharge level while the storage transistor connected to the data line DL1 is held OFF. The coupling decreases a level margin with respect to a reference potential and if the worst comes to the worst, there may occur a malfunction as a decision of the low level is made.

When the sense amplifiers are simultaneously activated, a large peak current flows into the circuit. The peak current also flows through the power supply line formed in the semiconductor integrated circuit and causes noise to be produced in the power supply voltage and the ground potential of the circuit because of the distributed resistance and the inductance component of the bonding wire. In order to prevent the storage transistor from losing the stored data through the read operation, the drain voltage is kept as low as 1 V. Since the amplitude of the signal read from the storage transistor to the data line is relatively small, the influence of the power supply noise results in reducing the operating margin of the sense amplifier.

Attempts have been made to microminiaturize elements in order to increase storage capacity. While current flowing into the storage transistor is small, a number of MOSFETs and the like are connected to the one data line so as to provide a large parasitic capacity. For this reason, a change in the level of the signal read from the selected storage transistor to the data line is slow and when a high-speed read operation is performed, the sense amplifier SA needs activating before the level of the signal read to the data line becomes sufficiently high. Therefore, the deterioration of the operating margin of the sense amplifier because of the noise is not ignorable. On the other hand, while the operating margin of the sense amplifier is secured, high-speed read can be achieved according to the present patent application using the divided data lines in the memory mat simultaneously with the divided sense amplifiers, and activating these sense amplifiers dispersedly in time. Moreover, the continuous access accompanied with the switching of the word line can be gained at high speed by alternately activating the divided data lines and sense amplifiers.

Figure 7:
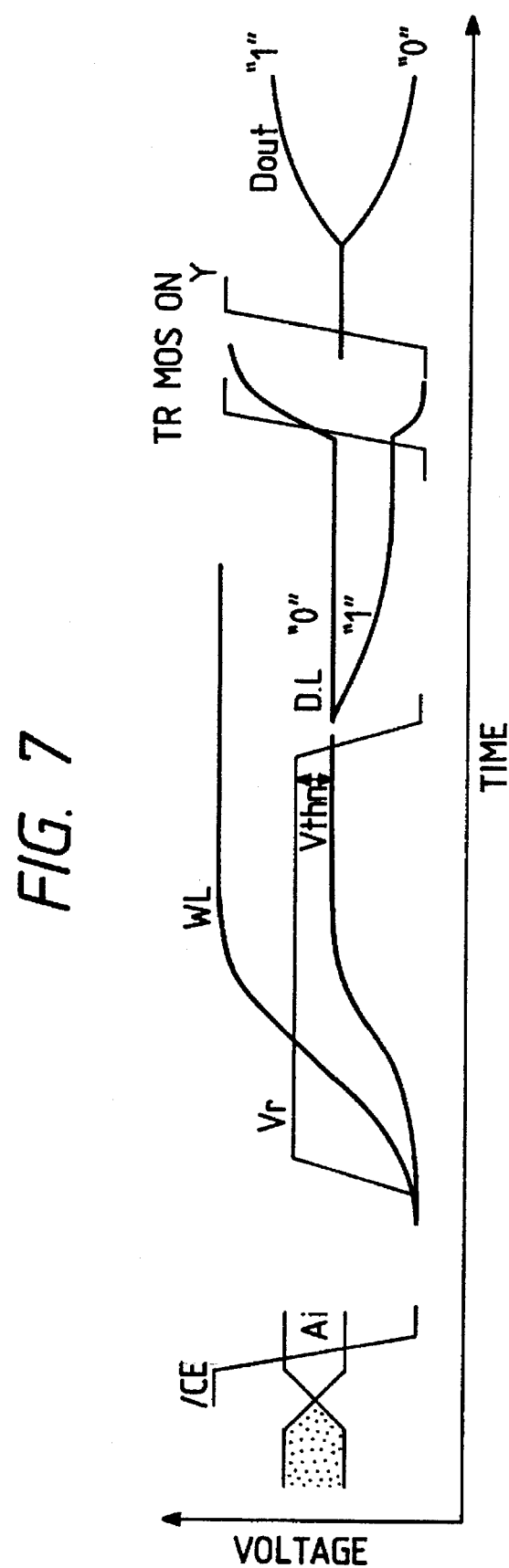
FIG. 7 is a fundamental waveform chart illustrating the read operation of an internal circuit of the semiconductor memory device according to the present invention.

FIG. 7 is a fundamental waveform chart illustrating the read operation of the internal circuit of the semiconductor memory device according to the present invention. When the chip enable signal /CE changes from the high level to the low level, the address buffer is activated and the address signal Ai is taken in. The address signal thus taken in, though not shown, is held in an address latch circuit.

The address signal thus taken in causes the wordline select and precharge operations to be started. In other words, the selected word line is set at the select level Vcc from 0 V. The precharge voltage Vr is set higher by the threshold Voltage Vthn of the precharge MOSFET with respect to a precharge level of about 1 V of the data line DL. In other words, the precharge MOSFET functions as a source follower circuit and sets the data line DL at a precharge level of Vr–Vthn.

When the data line DL is set at the precharge level, the precharge voltage Vr is set at the low level and the precharge MOSFET is turned off. When the threshold voltage of the storage MOSFET is high with respect to the select level of the word line WL, the potential of the data line DL is kept at the high level (precharge level) and stored data "0" is read out. When the threshold voltage of the storage MOSFET is low with respect to the select level of the word line WL, the potential of the data line DL is pulled out to the low level and stored data "1" is read out.

While the parasitic capacity of the data line DL is relatively large, the current flowing into the storage MOSFET in the "on" state is small and the transfer MOSFET (TRMOS) is turned on after the passage of time set to make obtainable a signal amplitude necessary for the operation of the sense amplifier. With the "on" state of the transfer MOSFET, the read signal is supplied to the sense amplifier SA to effect the amplification operation. While the data line DL remains at the high level (precharge level), it is amplified up to the level of the power supply voltage Vcc and while it remains at the low level, it is amplified up to the level of the ground potential of the circuit.

The amplified output of the sense amplifier SA is held in, though not necessarily limited to, the latch circuit of an output unit. One sense amplifier is selected by means of the Y select signal and the output level is inverted via the data output buffer, whereby the stored data "1" is output as what is at the high level, whereas the stored data "0" is output as what is at the low level.

Figure 8:
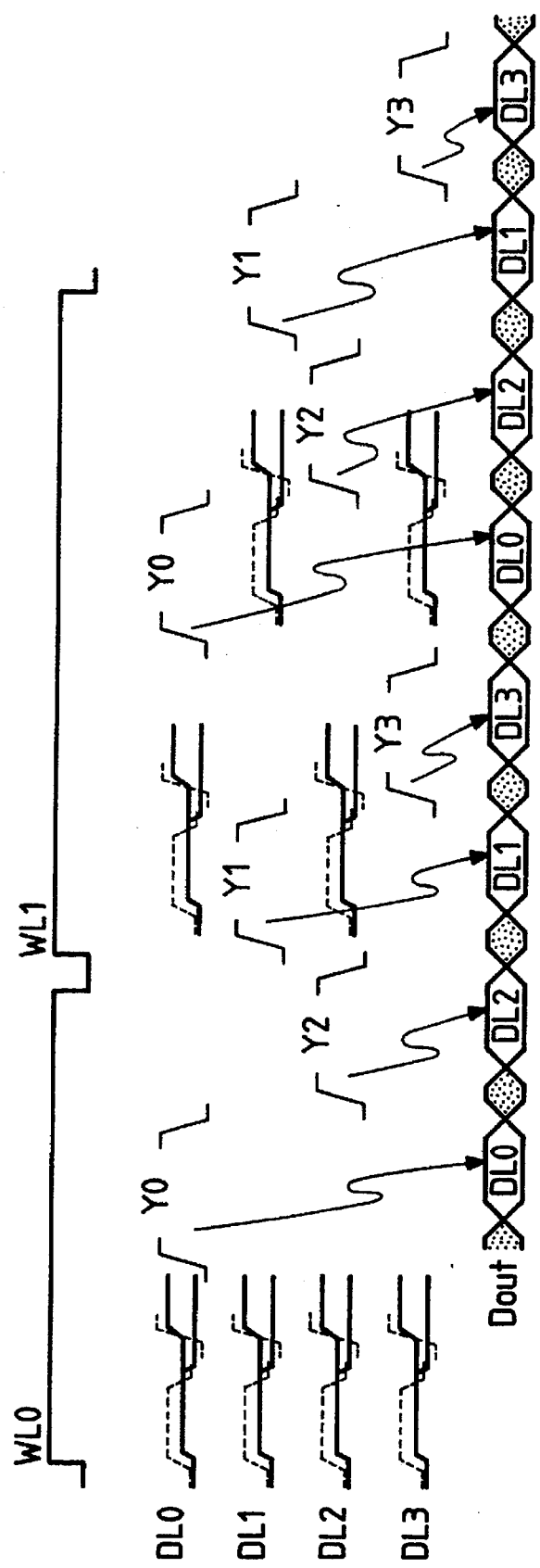
FIG. 8 is a waveform chart illustrating an example of the read operation corresponding to the embodiment of FIG. 3.

FIG. 8 is a waveform chart illustrating an example of the read operation corresponding to the embodiment of FIG. 3. FIG. 8 shows an example of the continuous read operation accompanied with the switching of the word line.

When a word line WL0 is selected in the initial cycle, all the data lines DL0–DL3 are activated, which is followed by the activation of all the sense amplifiers. The details of the operating waveform up to this stage are similar to those shown in FIG 7. In FIG. 8, the precharge voltage Vr and the signal for selecting the transfer MOSFET are indicated by dotted lines. The select signal Y0 is generated and data Dout corresponding to the data line DL0 is output, and subsequently the select signal Y2 is generated and data Dout corresponding to the data line DL2 is output.

In parallel to the outputting of data Dout corresponding to the odd-numbered data line DL1 corresponding to the select signal Y1, the switching of the word line is subsequently conducted. In other words, the word line WL0 is made non-select and a word line WL1 corresponding to the next address is selected instead. In accordance with the operation of selecting of the word line WL1, the precharge operation and the sense amplification operation are applied to the even-numbered data lines DL0, DL2 with the read operation terminated. In response to the switching of the word line, the transfer MOSFETs of the odd-numbered data lines DL1, DL3 where the data is being output are turned off. In other words, the data held by the sense amplifier SA is sequentially output as long as the outputting of the data Dout corresponding to the odd-numbered data line DL is concerned.

Subsequent to the outputting of the data Dout corresponding to the data line DL1, data Dout corresponding to the data line DL3 is output in response to the select signal Y3. Then the select signal Y0 is generated again and the data Dout of the data line DL0 corresponding to the word line WL1 is output. During this time, the signals read to the data lines DL1, DL3 as a result of the operation of selecting the word line WL2 are amplified by the sense amplifiers. Hereafter, data Dout corresponding to the data lines DL2, DL1 and DL3 are successively output in response to the select signals Y2, Y1 and Y3. The switching of the word line is conducted again at the timing the outputting of the data Dout corresponding to the even-numbered data line DL2 is terminated.

Figure 9:
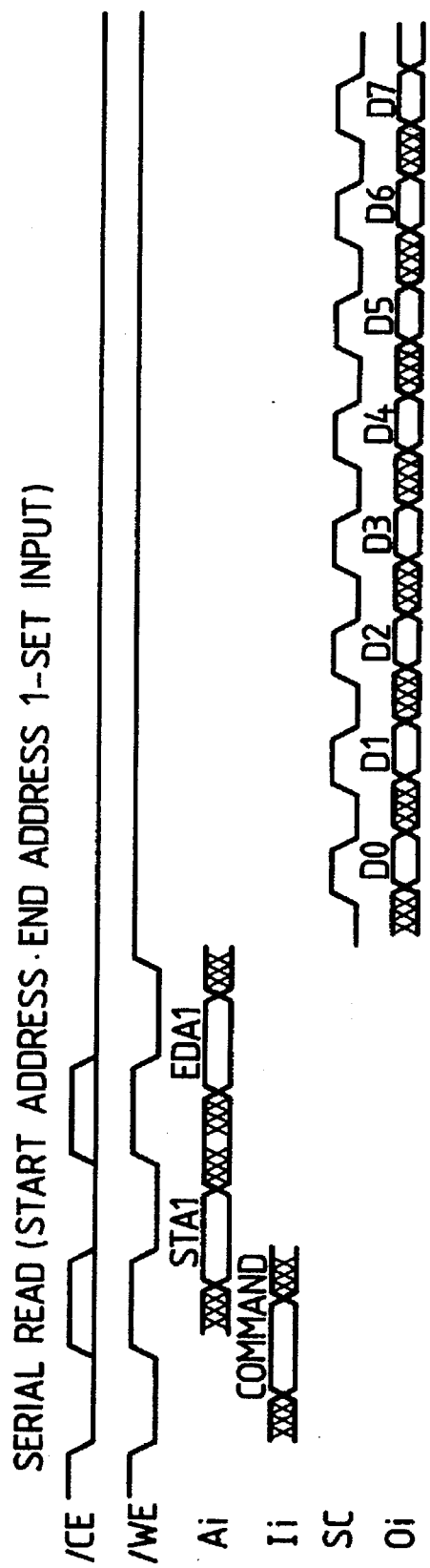
FIG. 9 is a timing chart of a continuous read operation in the semiconductor memory device according to the present invention.

FIG. 9 is a timing chart of a continuous read operation in the semiconductor memory device according to the present invention. A command is retrieved from input data Ii by, though not necessarily limited to, setting the chip enable signal /CE and the write enable signal /WE both at the low level. When the mode of inputting one set of start and end addresses is designated by this command, a start address STA1 and an end address ED1 are retrieved by leaving /CE only or together with /WE at the low level.

While the signal /CE is set at the low level, /WE is reset at the high level so as to supply the clock signal SC. Accordingly, continuous serial data ranging from data D0 corresponding to the start address STA1 up to data 7 corresponding to the end address EDA1 are obtainable in synchronization with the clock signal SC.

Figure 10:
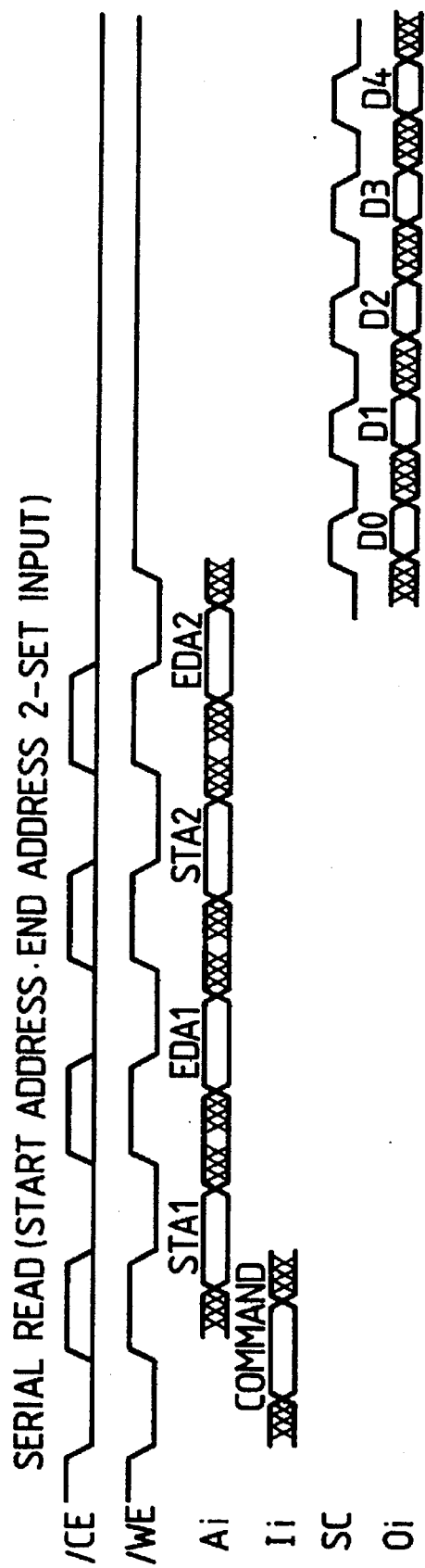
FIG. 10 is a timing chart of another continuous read operation in the semiconductor memory device according to the present invention.

FIG. 10 is a timing chart of another continuous read operation in the semiconductor memory device according to the present invention. As noted previously, a command is retrieved from input data Ii by setting the chip enable signal /CE and the write enable signal /WE both at the low level likewise. When the mode of inputting two sets of start and end addresses is designated by this command, the first start and end addresses STA1, ED1 and the second start and end addresses STA2, ED2 are retrieved by leaving /CE only or together with /WE at the low level.

While the signal /CE is set at the low level, /WE is reset at the high level so as to supply the clock signal SC then. Accordingly, output data Oi causes data D0 corresponding to the first start address STA1 up to what corresponds to the first end address EDA1 to be output sequentially and serially in synchronization of the clock signal SC first and then causes those respectively corresponding to the second start address STA2 up to the second end address EDA2 to be serially output likewise. In FIG. 10, there is shown an exemplary waveform chart of data D0–D4 corresponding to the first start address STA1.

Figure 11:
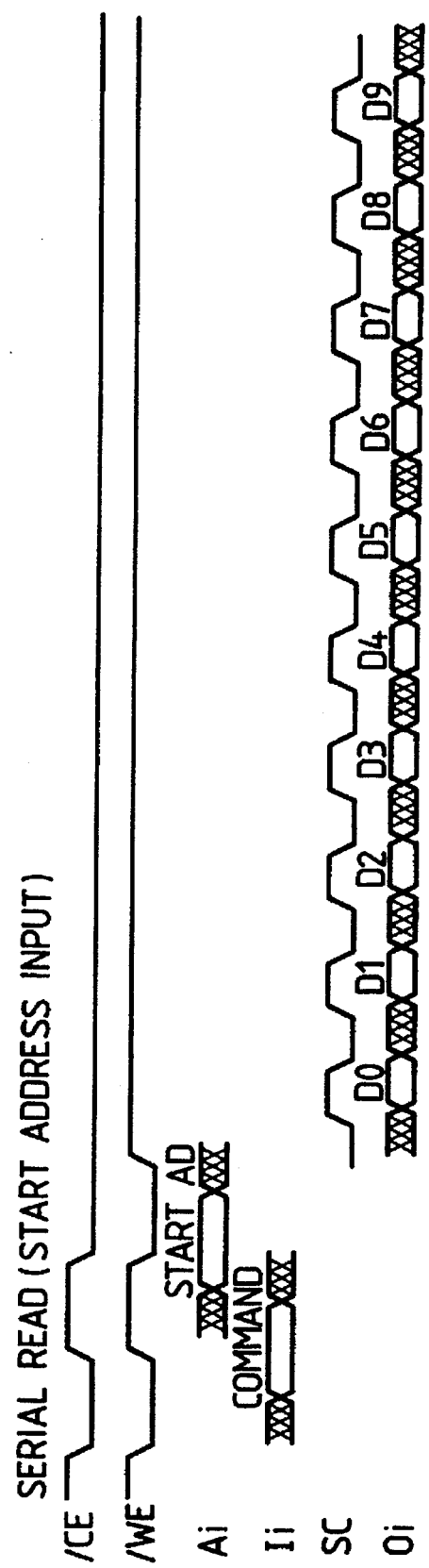
FIG. 11 is a timing chart of still another continuous read operation in the semiconductor memory device according to the present invention.

FIG. 11 is a timing chart of still another continuous read operation in the semiconductor memory device according to the present invention. As noted previously, a command is retrieved from input data Ii by setting the chip enable signal /CE and the write enable signal /WE both at the low level likewise. With this command, the following three kinds of read are carried out. A start address START is retrieved by leaving /CE only or together with /WE at the low level.

In a first mode, data for one word line is serially read out. In other words, while the signal /CE is set at the low level, /WE is reset at the high level so as to supply the clock signal SC. Accordingly, output data Oi causes data D0 corresponding to the start address START AD of the selected word line up to what corresponds to the last address in Y series to be sequentially output in synchronization with the clock signal SC.

In a second mode, data in a memory cell for one block is serially read out. In other words, while the signal /CE is set at the low level, /WE is reset at the high level so as to supply the clock signal SC. Accordingly, output data Oi causes data D0 corresponding to the start address START AD up to stored data of the memory cell at the last address in Y series corresponding to the last word line in the block to be sequentially output in synchronization of the clock signal SC. In such a case where the start address START AD corresponds to the last word line, this mode is substantially equal to the first mode.

As long as the clock signal SC is being supplied, serial read is carried out in the second mode. In other words, while the signal /CE is set at the low level, /WE is reset at the high level so as to supply the clock signal SC. Accordingly, output data Oi causes data to be read out until the supply of the clock signal SC from data D0 corresponding to the start address START AD is stopped. In FIG. 11, there is shown an exemplary sequential waveform chart of the start address START AD up to D0–D9 in each mode.

Figure 12:
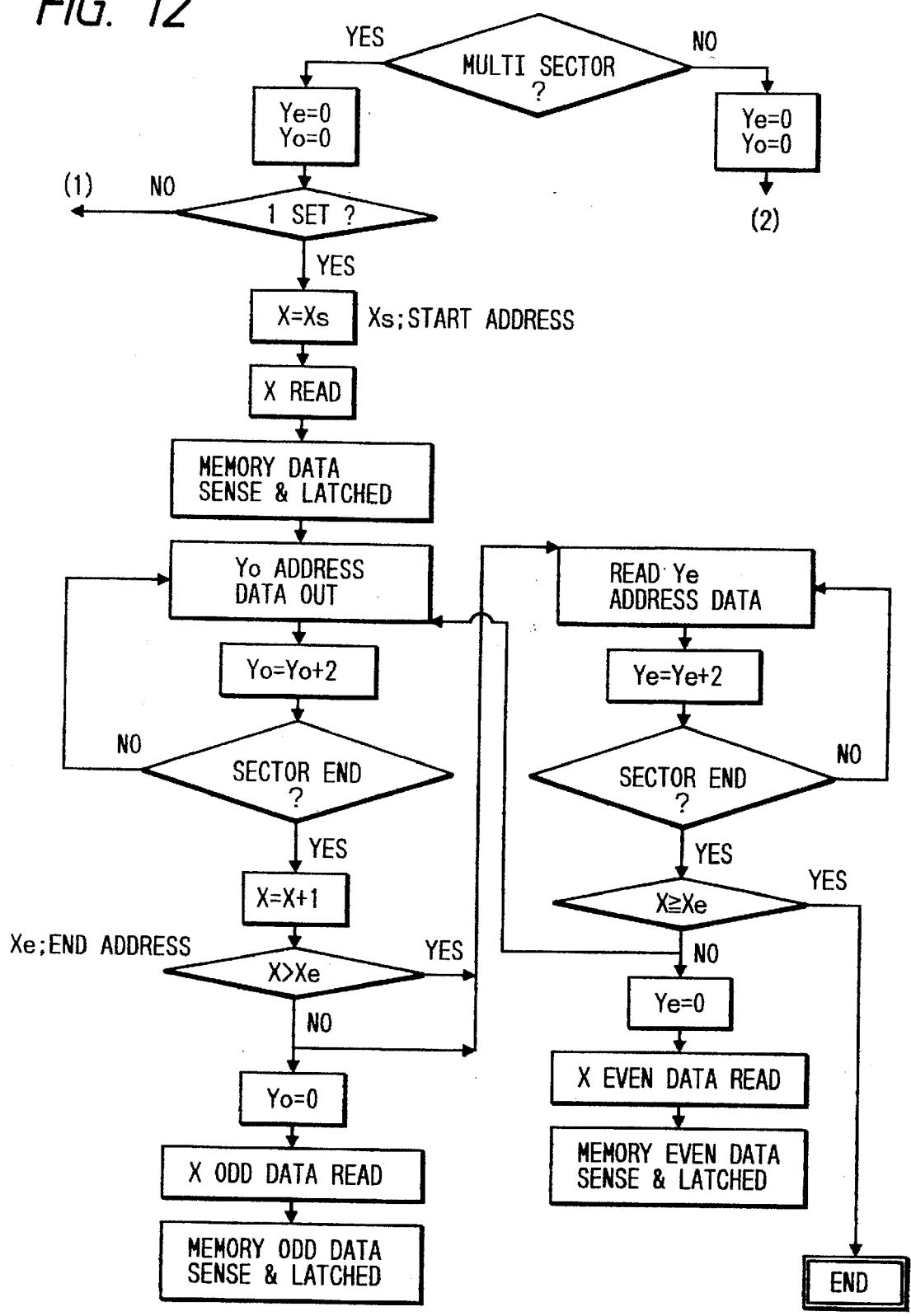
FIG. 12 is a flowchart illustrating the operation of the internal circuit corresponding to the operating mode of FIG. 9.

FIG. 12 is a flowchart illustrating the operation of the internal circuit corresponding to the operating mode of FIG. 9 above. When a decision of a multi-select mode is made through a command, even and odd addresses Ye, Yo in Y series are reset to decide whether 1-set mode is followed. When a decision of the 1-set mode is made, an X address is set to an start address Xs and the read operation is started.

Since the odd- and even-numbered are alternately caused to generate output according to this embodiment, data read to the data line, the amplification operation of the sense amplifier and the latch operation are performed in parallel on the odd address side when data output is shifted to the even address, whereas data read to the data line, the amplification operation of the sense amplifier and the latch operation are performed in parallel on the even address side when data output is shifted to the odd address.

A decision on a sector end is what is made on whether read of all the even or odd data lines within the selected word line becomes terminated. In other words, the memory cells for one word line are divided into odd and even ones, each of which is dealt with as one sector. A second-stage Y-Gate is provided on the following stage side of the Y-Gate YG of FIG. 3 and the other even- or odd-numbered data lines in the memory mat are sequentially read by switching the second-stage Y-Gate.

Figure 13:
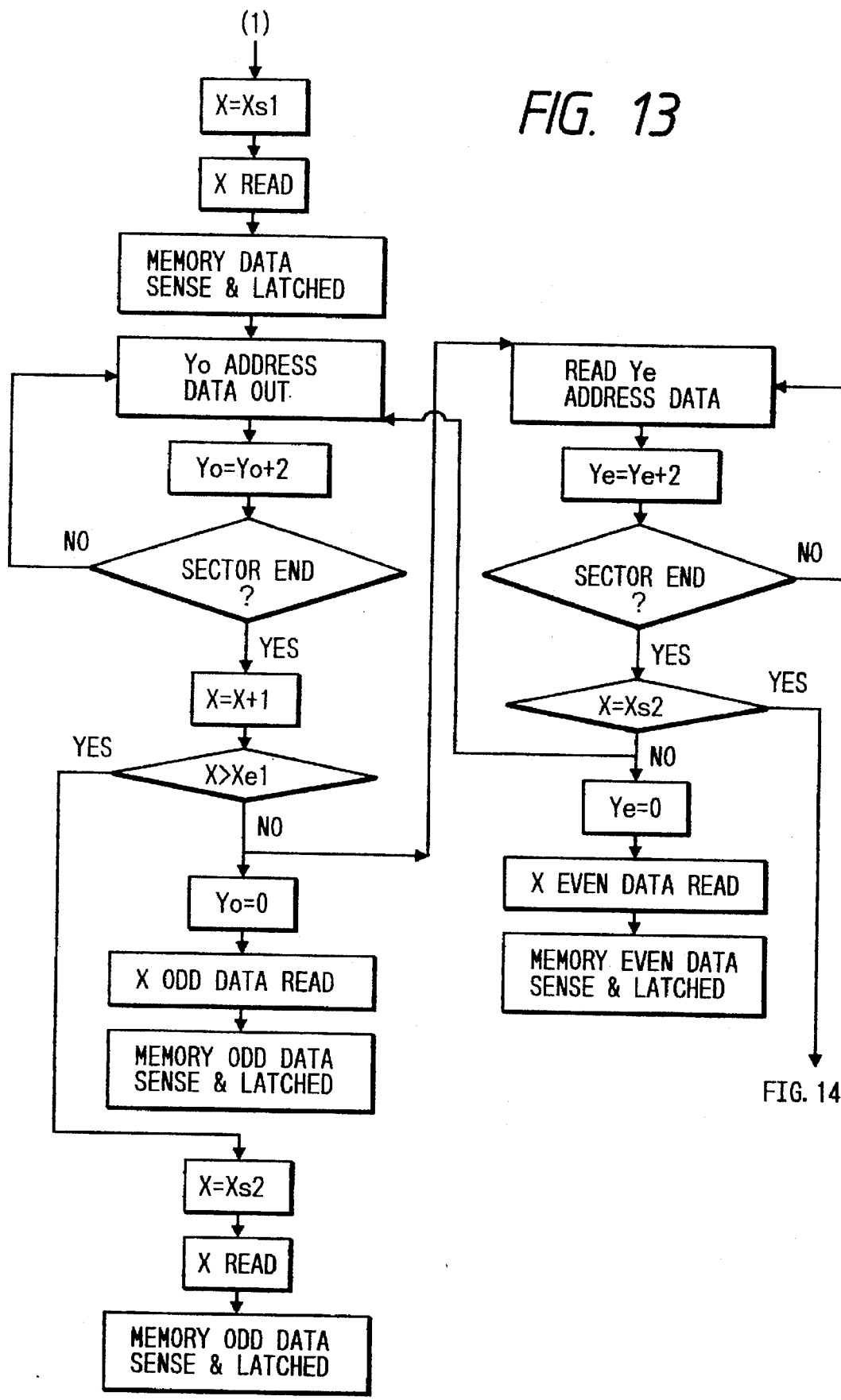
FIG. 13 shows a part of the flowchart illustrating the operation of the internal circuit corresponding to the operating mode of FIG. 10.
Figure 14:
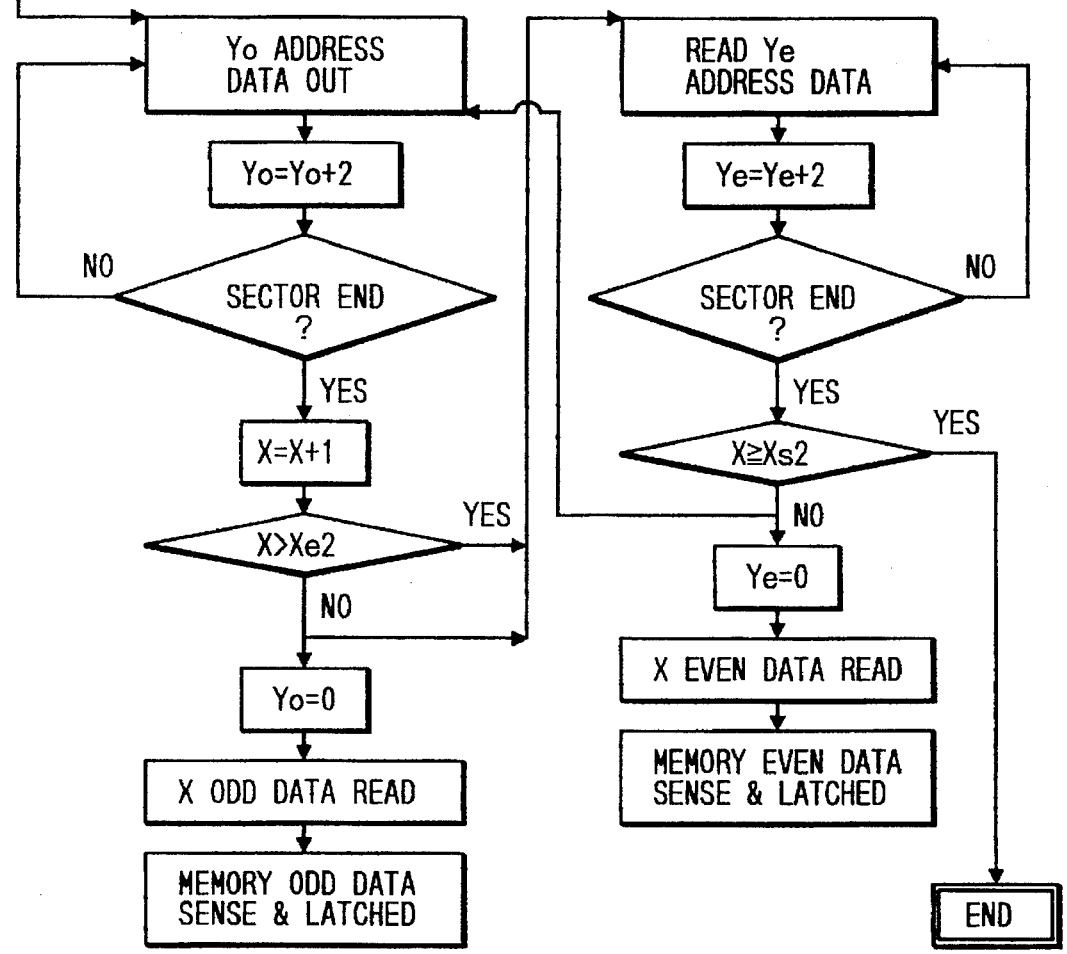
FIG. 14 shows the remaining part of the flowchart illustrating the operation of the internal circuit corresponding to the operating mode of FIG. 10.

FIG. 13 and FIG. 14 are flowcharts illustrating the operation of the internal circuit corresponding to the operating mode of FIG. 10 above. When a decision of the multi-select mode is made through a command and when a decision of the 2-set mode is made in FIG. 12 above, an X address is set to a first start address Xs1 as shown in FIG. 13 and the read operation is started.

When the X address becomes greater than a first end address Xe1, there follow the setting of a second start address Xs2, the activation of the corresponding data line, the amplification operation of the sense amplifier and the latch operation. When read up to the odd-numbered last sector is terminated, a decision is made on the fact that the X address has been set to the second start address Xs2 and data is serially output up to a second end address Xe2 as shown in FIG. 15.

Figure 15:
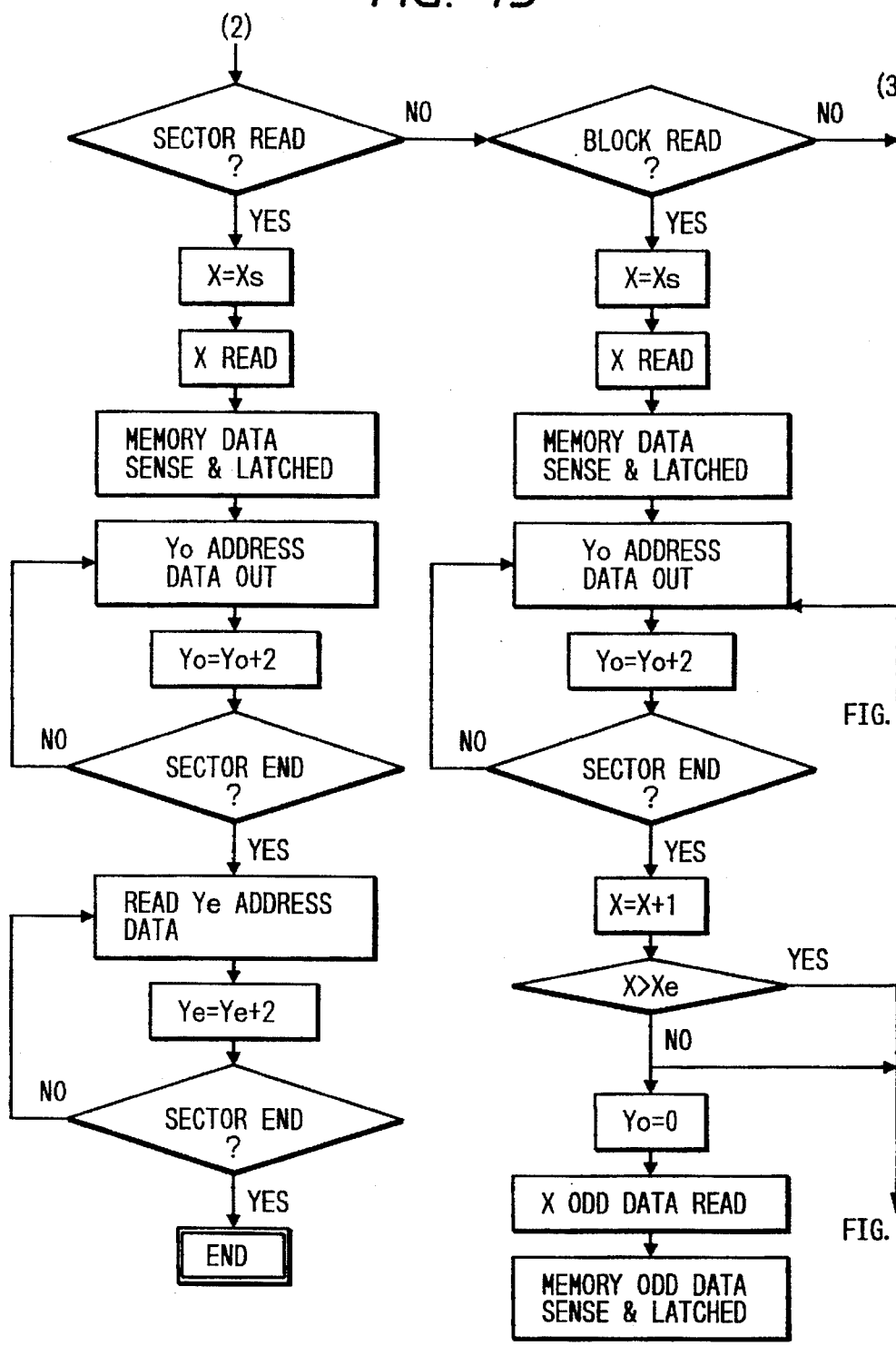
FIG. 15 shows a part of the flowchart illustrating the operation of the internal circuit corresponding to the operating mode of FIG. 11.
Figure 16:
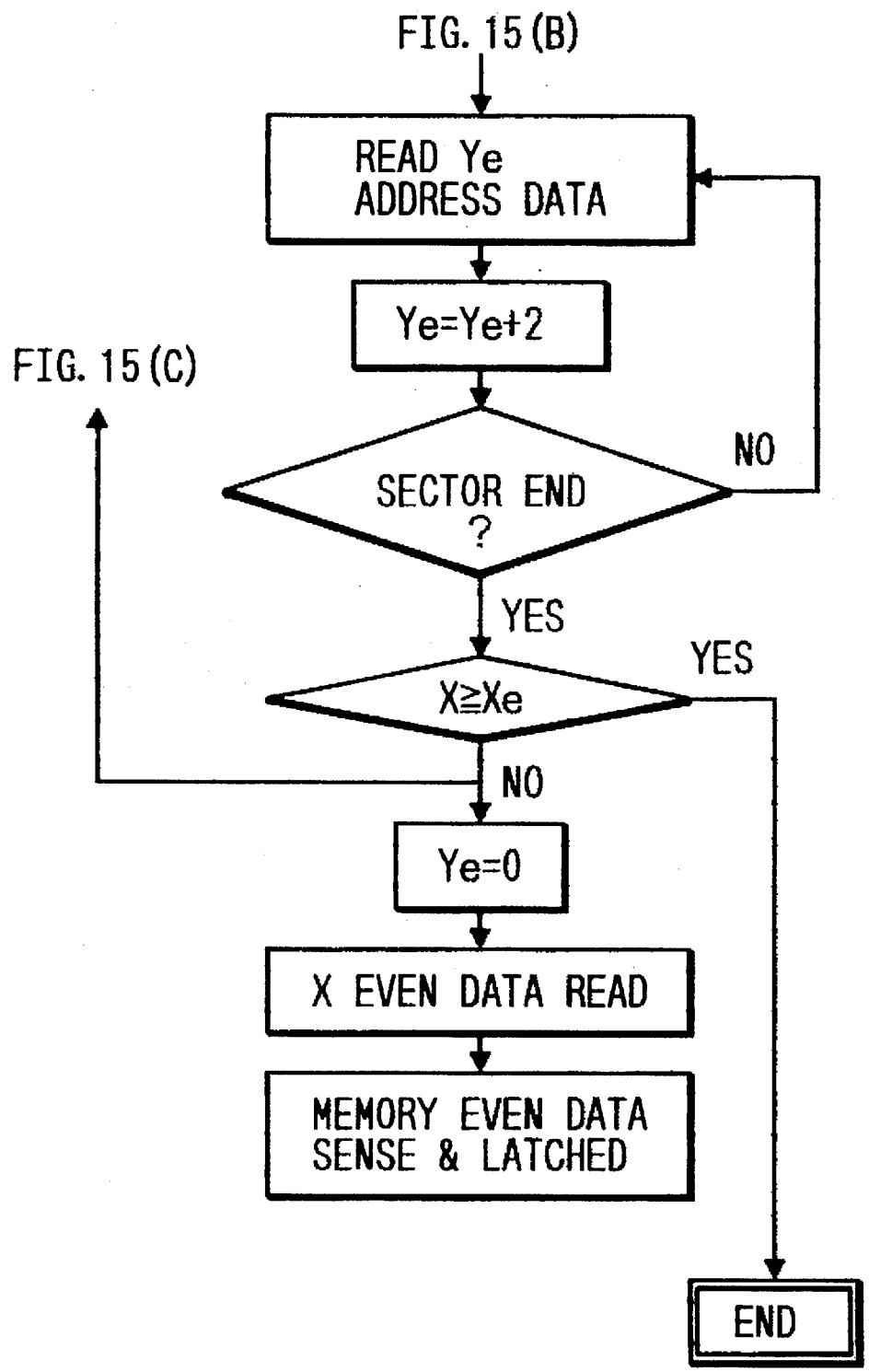
FIG. 16 shows another part of the flowchart illustrating the operation of the internal circuit corresponding to the operating mode of FIG. 11.
Figure 17:
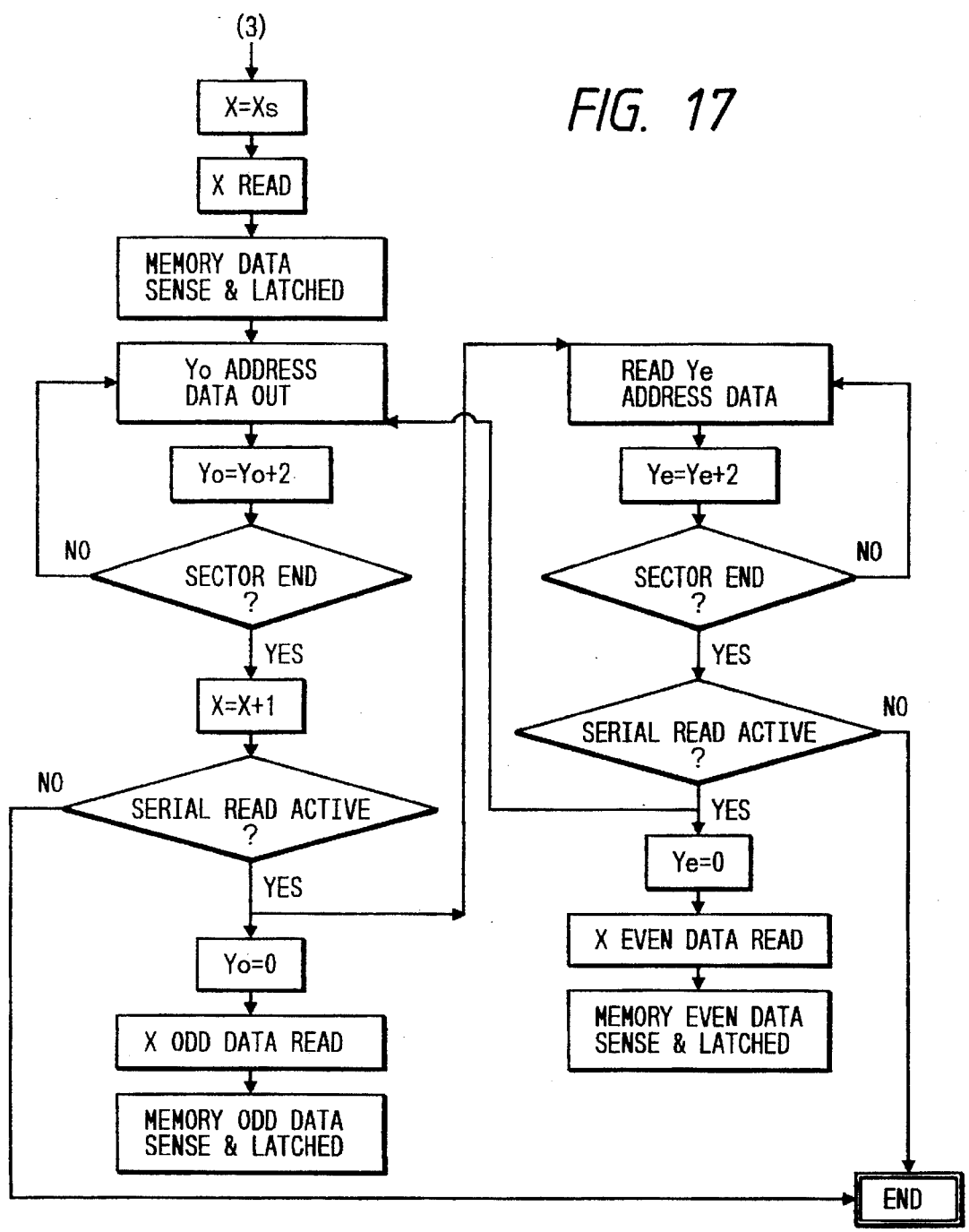
FIG. 17 shows the remaining part of the flowchart illustrating the operation of the internal circuit corresponding to the operating mode of FIG. 11.

FIG. 15, FIG. 16 and FIG. 17 are flowcharts illustrating the operation of the internal circuit corresponding to the operating mode of FIG. 11 above. FIG. 15 shows part of the flowchart in the first halves of the first and second modes. When a decision not to follow a multi-select mode is made and when a decision of sector read (first mode) is made in FIG. 15, an X address is set to a start address Xs1 and the read operation is started. A decision on the termination of the read operation depends on the sector end. In other words, the end is decided by making a Y address the last address.

When a decision of block read (second mode) is made in FIG. 15, the X address is set to the start address Xs1 and the read operation is started. When the odd address within one sector has been read during the read operation, data output is shifted to the even address and there follow the switching of the word line on the odd address side, the activation of the odd data line side, and the amplification operation of the sense amplifier and the data latch operation in parallel.

In FIG. 16, with the output operation on the even side and the sector termination, data output is shifted to the odd side shown in FIG. 15 unless access up to a block end address Xe is gained and there follow data read on the even address side, the amplification operation of the sense amplifier and the data latch operation. On condition that access up to the end address Xe is gained, the block read is terminated.

When no decision of the block read (second mode) is made in FIG. 17, a third mode is automatically followed and the start address Xs1 is set so as to start the read operation. The read operation is continued until the termination of the serial read is instructed as the supply of the clock signal SC is stopped.

Figure 18:
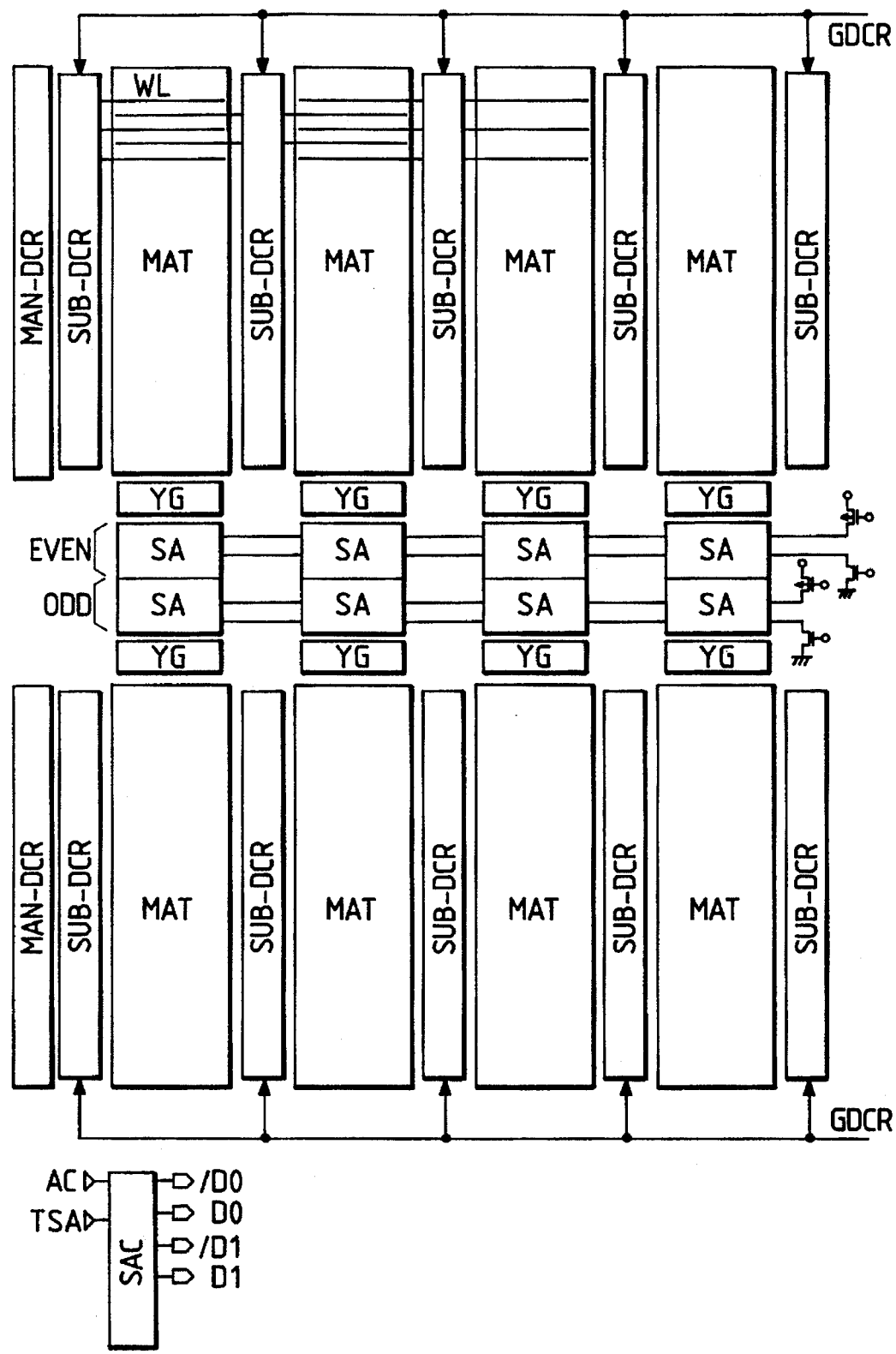
FIG. 18 is a block diagram of the principal part of another semiconductor memory device embodying the present invention.

FIG. 18 is a block diagram of the principal part of another semiconductor memory device embodying the present invention. According to this embodiment, differential sense amplifiers SA are employed. The differential sense amplifier SA comprises, though not necessarily limited to, a pair of CMOS invertor circuits whose inputs and outputs are cross-coupled and latched as those employed in a dynamic RAM (Random Access Memory). The activation of such a sense amplifier SA is conducted via a power switch MOSFET including P- and N-channel MOSFETs.

According to this embodiment, the sense amplifier SA is disposed between a pair of memory mats vertically arranged. The sense amplifiers SA are divided into two groups for even and odd data lines. Although the even and odd sense amplifiers SA are shown to be those vertically arranged in FIG. 18, actually they may be disposed on one straight line.

The inputs of the pair of even sense amplifiers SA are connected to the even-numbered data lines of upper and lower memory mats, whereas the input of the pair of odd sense amplifiers SA are connected to the odd-numbered data lines of upper and lower memory mats. Sub-decoders SUB-DCR, main decoders MAN-DCR and gate decoders GDCR corresponding to the memory mats are provided similarly as in the case of FIG. 1.

A sense amplifier control circuit SAC generates even sense amplifier activating signals /D0, D0 and odd sense amplifier activating signals /D1, D1. The signal /D0 is supplied to the P-channel MOSFET for supplying power supply voltage to the even sense amplifier SA, whereas the signal D0 is supplied to the N-channel MOSFET for supplying the ground potential of the circuit to the even sense amplifier SA. Equally, the signal /D1 is supplied to the P-channel MOSFET for supplying power supply voltage to the odd sense amplifier SA, whereas the signal D1 is supplied to the N-channel MOSFET for supplying the ground potential of the circuit to the odd sense amplifier SA. As an address buffer, input/output buffers, control circuits, a voltage generator circuit and so forth are similar to those shown in FIG. 1, the illustration of these components is omitted in FIG. 18.

Figure 19:
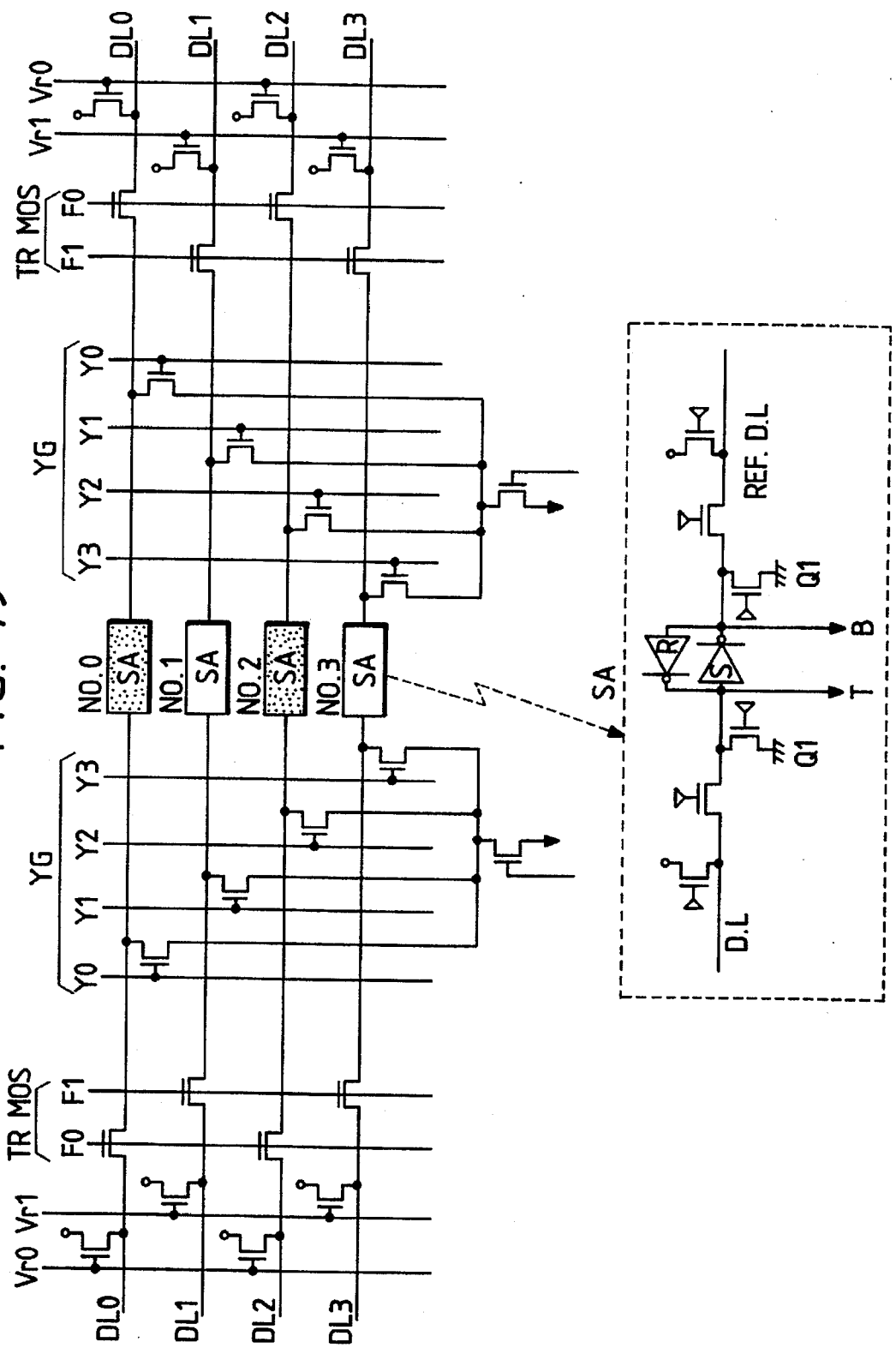
FIG. 19 is a circuit diagram illustrating the relation between the data lines and differential sense amplifiers of the semiconductor memory device according to the present invention.

FIG. 19 is a circuit diagram illustrating the relation between data lines and differential sense amplifiers according to the present invention. FIG. 19 shows a pair of four data lines DL0~DL3 of two memory mats with sense amplifiers SA held therebetween and the corresponding four sense amplifiers SA by way of example.

The sense amplifier SA whose circuit diagram is shown in a portion enclosed with a dotted line comprises the pair of CMOS invertor circuits with their inputs and outputs being cross-coupled. As the latch circuit formed with the CMOS invertor circuit is activated by the switch MOSFET (the so-called Deka MOS), it performs an operation practically similar to what is performed by a clocked invertor circuit. Consequently, the pair of CMOS invertor circuit are indicated in the form of a clocked invertor circuit.

A MOSFET Q1 for setting an input node at 0 V is provided at each input of the sense amplifier, whereby the input signal is set at 0 V prior to the start of the amplification operation. The pair of inputs of the sense amplifier SA are connected via transfer MOSFETs (TRMOS) to the data lines DL0~DL3. The transfer MOSFETs are divided into two groups which correspond to the even-numbered data lines DL0, DL2 and the odd-numbered data lines DL1, DL3 and are supplied with select signals F0, F1, respectively. Precharge voltage Vro is correspondingly supplied to the gates of precharge MOSFETs provided for the even data lines DL0, DL2, whereas precharge voltage Vr1 is correspondingly supplied to the gates of precharge MOSFETs provided for the odd data lines DL1, DL3.

The switch MOSFETs forming a Y-gate YG are provided at the pair of inputs of the sense amplifier SA and select signals Y0~Y3 are supplied to the respective gates. The arrangement is similar to what is shown in FIG. 3. The outputs of the Y-gate YG are put for common use and connected via the switch MOSFET forming the second-stage Y-gate to the input/output data lines led to the data input/output buffers.

With respect to the pair of memory mats, one of them is activated when the other is deactivated. In the case of the memory mat to be deactivated, despite its inactive state, the transfer MOSFET is held "on", and the data line corresponding thereto is connected to the input of the sense amplifier. On the inactive memory mat side, precharge voltage Vr is lowered and the potential of such a data line is set at the level intermediate between the high and low levels of the data line of the activated memory mat. Consequently, the data line of the memory mat on the inactive side is used to form the reference voltage (Ref. DL) of the sense amplifier.

According to this embodiment, the write data is latched and held during the program operation in accordance with the arrangement of sense amplifiers SA using CMOS latch circuits. In other words, the even and odd transfer MOSFETs are simultaneously turned on and the program operations are performed at the same time after the Y-gates YG are sequentially opened so as to set the write data. The operating voltage of the sense amplifier is switched to 4 V in response to the program operation. Like the embodiment of FIG. 3, on the other hand, the even and odd data lines are alternately activated during the read operation and at the time of program verify excluding the initial cycle.

Figure 20:
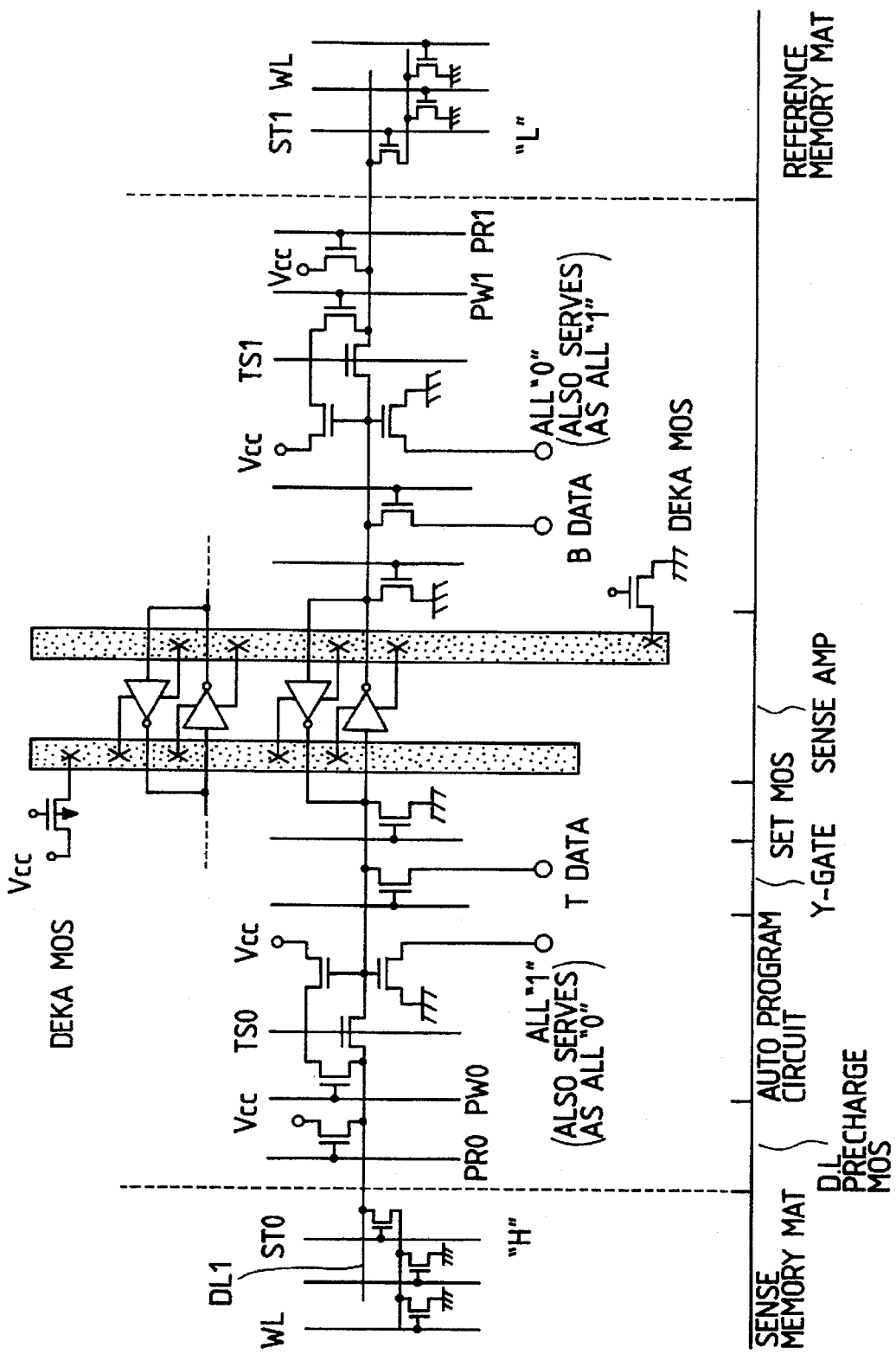
FIG. 20 is another circuit diagram illustrating the relation between the data line and differential sense amplifier of the semiconductor memory device according to the present invention.

FIG. 20 is another circuit diagram illustrating the relation between the data line and the differential sense amplifier according to the present invention. According to this embodiment, an automatic program function is added to what is shown in FIG. 19.

Figure 21A:
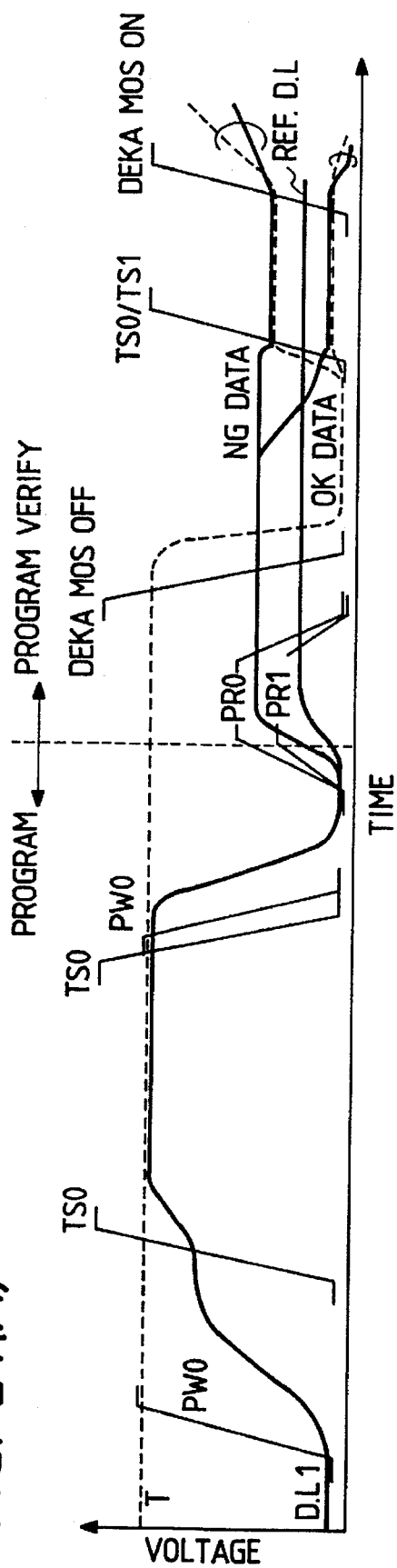
FIGS. 21(A) and (21B) are waveform charts illustrating an example of the operation of the circuit of FIG. 20.

FIG. 21 is a waveform chart illustrating an example of the operation of the circuit of FIG. 20. FIG. 21(A) is a waveform chart illustrating write (program) and write verify (program verify) operations. Referring to the waveform, the automatic write function will be described. During the program operation, write data T Data is supplied via the Y-Gate to the sense amplifier. At this time, the sense amplifier has been activated as the switch MOS (Deka MOS) is held "on" and is caused to hold the program data and a signal PW0 is used to turn on MOSFET. If the program data is at the low level, the potential of the data line DL1 will remain at the low level because the MOSFET of an automatic program circuit for receiving the program data is held "off". If, however, the program data is at the high level as shown in FIG. 21(A), the MOSFET is turned on and the potential of the data line DL1 is charged up by the power supply voltage Vcc via the MOSFET which is turned on by means of the signal PW0.

Subsequently, a signal TS0 is set higher than Vcc. The transfer MOSFET is turned on accordingly so that the potential of the data line DL1 is raised up to about 4 V necessary for the write operation. Although not shown in shown in FIG. 21, high voltage directed to the drain is applied between the floating gate and the drain as the word line is set at a voltage of, for example, −10 V, and the tunnel current flowing from the floating gate to the drain causes the write operation to be performed.

The signal PW0 is set at the low level on the termination of the program operation and the short MOSFET shown in FIG. 2 is turned on, whereby the potential of the data line DL1 is set at the low level to effect migration to program verify. In other words, a signal PR0 is set to the precharge voltage Vr and the data line DL1 is precharged. Since a signal PR1 on the non-select side is set at potential corresponding to the reference voltage as noted previously, the potential of the data line DL1 on the non-select memory mat side is set at the reference voltage Ref. DL.

The Deka MOSFET is turned off and the sense amplifier is made inactive once. When the threshold voltage of the storage MOSFET to which data has been programmed is decreased, the potential of the data line DL1 is reduced to the low level (OK Data) and caused to remain at the high level (NG data), provided that the threshold voltage hangs low with insufficient programmed data. The transfer MOSFET is turned on by means of the signals TS0, TS1 and the read data together with the reference voltage Ref. DL is supplied to the input of the sense amplified. Then the Deka MOSFET is turned on and activated.

If the verified result is unsatisfactory as noted previously, the program operation is performed again a predetermined limited number of times until the above low-level signal is obtained. When the predetermined number of program operations thus performed is decided unsatisfactory, the memory cell is judged defective and replaced with a redundancy circuit as occasion demands.

Figure 21B:
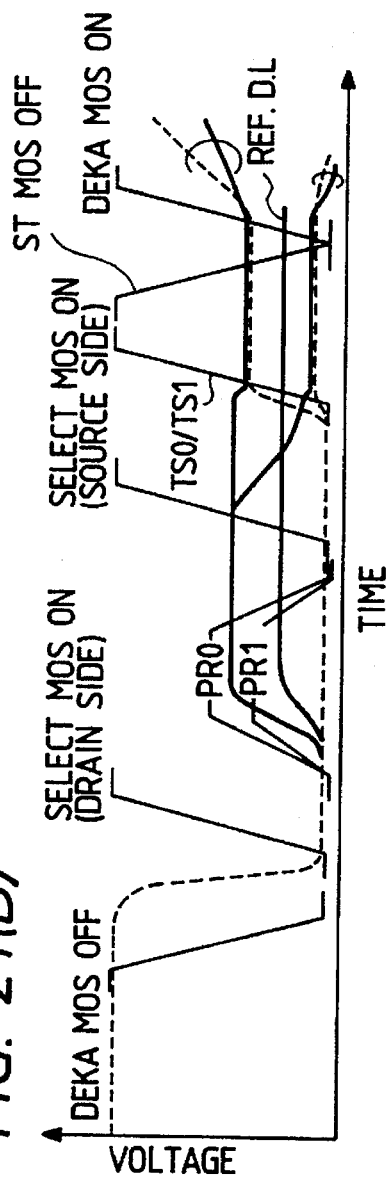

FIG. 21(B) is a waveform chart illustrating a read operation. On the termination of the preceding read operation, the Deka MOSFET is turned off. The potential of the data line DL is set at the low level by the set MOSFET. Then the select MOSFET on the drain side of the memory cell in each block is turned on. Further, the precharge voltages PR0, PR1 causes the pair of data lines to be set at the precharge voltage and the reference voltage respectively in according with the selection-select of the memory mat. Subsequently, the select MOSFET on each side of the memory cell in the block is turned on and the potential of the data line on the select memory mat side is left at the precharge level or provided the selected storage MOSFET remains in the "off" state or the potential thereof is pulled out by the memory current to the low level on condition that the selected storage MOSFET remains in the "on" state.

The signals TS0, TS1 are set at the high level so as to turn on the transfer MOSFET and the pair of data lines are connected to the input of the sense amplifier. Further, the set MOSFET is turned off and the Deka MOSFET is turned on to activate the sense amplifier. The amplification of the read signal is then conducted.

In the embodiment of FIG. 20, MOSFET for receiving the input voltage of the sense amplifier is provided as an all "1" detection circuit; in other words, this MOSFET is wired ORed with MOSFET provided at the input of another similar sense amplifier and when the data lines that have been read are totally at the low level, all these MOSFETs are turned off, so that a high-level detection signal is obtainable. When the input of any other sense amplifier is at the high level, MOSFET is turn off and a low-level detection signal is formed, whereby "1" of all the signals can be detected as all the MOSFETs are in the "off" state. FIG. 20 indicates that the data line to the left of the sense amplifier is in the erase state when the result read from the memory cell is "1".

When it is arranged to cause the output of the sense amplifier to be produced by what is similar to the circuit on the left side, the program and erase logical levels are reversed on the right-side data line. In other words, though the memory cell provided for the data line to the right of the differential sense amplifier is placed in the erase state at its low-level output, it is decided to be in the erase state at the time of all "0" as viewed from the external terminal.

FIG. 22 is still another circuit diagram illustrating the relation between the data line and the differential sense amplifier according to the present invention. According to this embodiment, the precharge MOSFET is omitted. In other words, the program signals PW0, PW1 are allowed to have a precharge function for reading purposes so that the precharge MOSFET can be dispensed with.

FIG. 23 is a waveform chart illustrating an example of the operation of the circuit. FIG. 23(A) depicts the program and verify operations and FIG. 23(B) the read operation. As shown in FIG. 23, a signal PW is employed even during the program, verify and read operations, and the voltage level is varied in conformity with each operating mode; that is, the signals PW, PR of FIG. 21 are attained by the one signal PW.

The precharge MOSFET is provided as what corresponds to each data line. In the case of a semiconductor memory device having a storage capacity of as large as about 32 bits, the number of precharge MOSFETs to be omitted becomes large correspondingly as that of data lines comes up to as many as, for example, 4,096 or 8,192.

Figure 24:
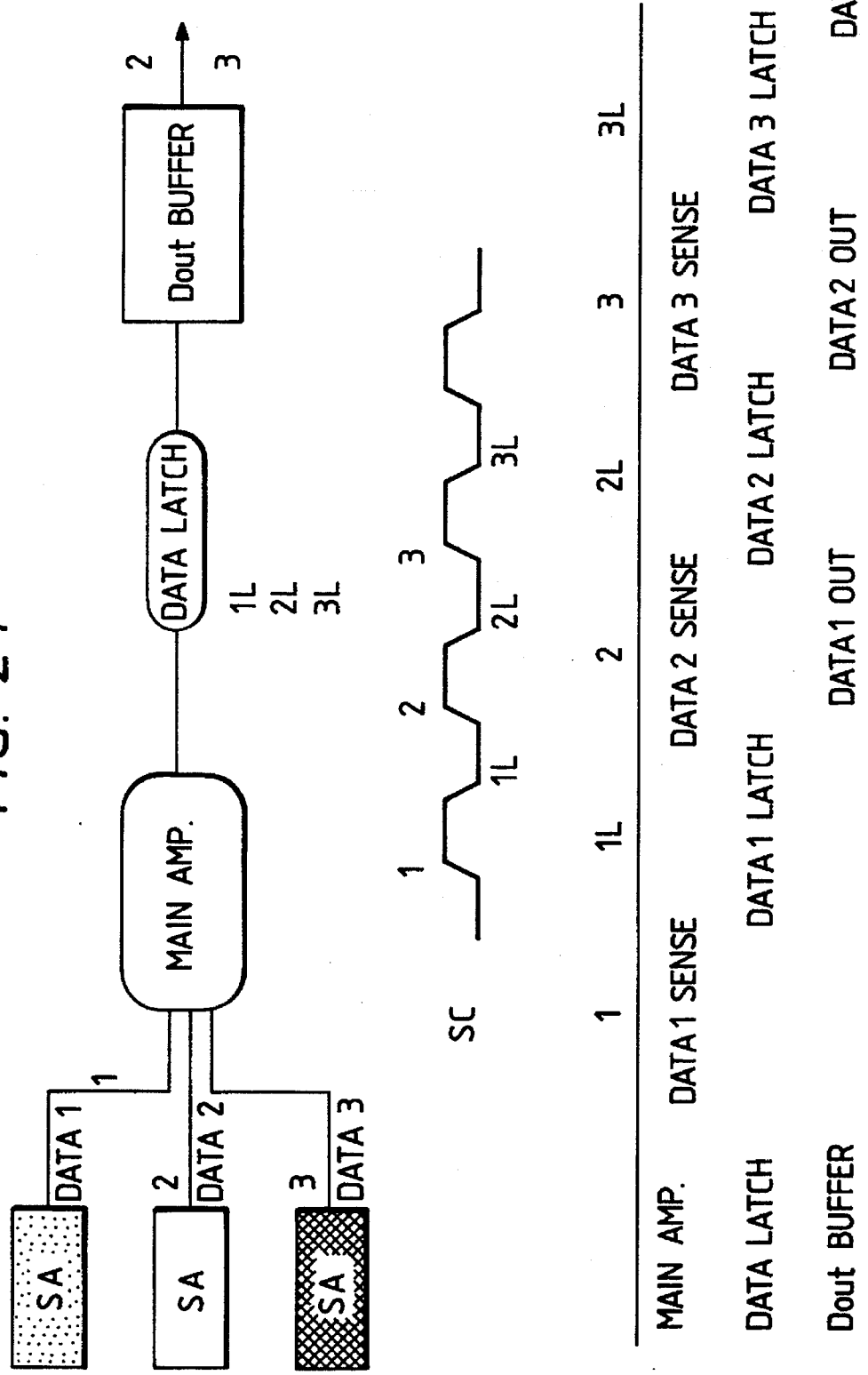
FIG. 24 is a block diagram illustrating another read circuit of the semiconductor memory device according to the present invention.

FIG. 24 is a block diagram illustrating another read circuit of the semiconductor memory device according to the present invention. According to this embodiment, a main amplifier (Main Amp) is provided at the following stage of the sense amplifier. The data latch is provided at the following stage of the main amplifier and read data is output through the data latch and the data output buffer (Dout Buffer).

According to this embodiment, there are provided, though not necessarily limited to, three sense amplifiers SA. The main amplifier amplifies Data 1 from the first sense amplifier in response to the initial pulse 1 of the clock signal SC. When the clock signal SC is at a low level 1L, the data latch latches the Data 1 amplified by the main amplifier. The main amplifier amplifies Data 2 from the second sense amplifier in response to the second pulse 2 of the clock signal SC. In parallel to these operations, the data output buffer causes the Data 1 fetched by the data latch to be output. When the clock signal SC is at a low level 2L, the data latch latches the Data 2 amplified by the main amplifier.

The main amplifier amplifies Data 3 from the third sense amplifier in response to the third pulse 3 of the clock signal SC. In parallel to these operations, the data output buffer causes the Data 2 fetched by the data latch to be output. When the clock signal SC is at a low level 3L, the data output buffer causes the data 3 fetched by the data latch to be output by means of the high level of the following clock signal SC (not shown). The data can thus be output at high speed through the pipeline-like serial operation. In this case, it may also be arranged to supply the output of the main amplifier to the data output buffer with the omission of the data latch.

Figure 25:
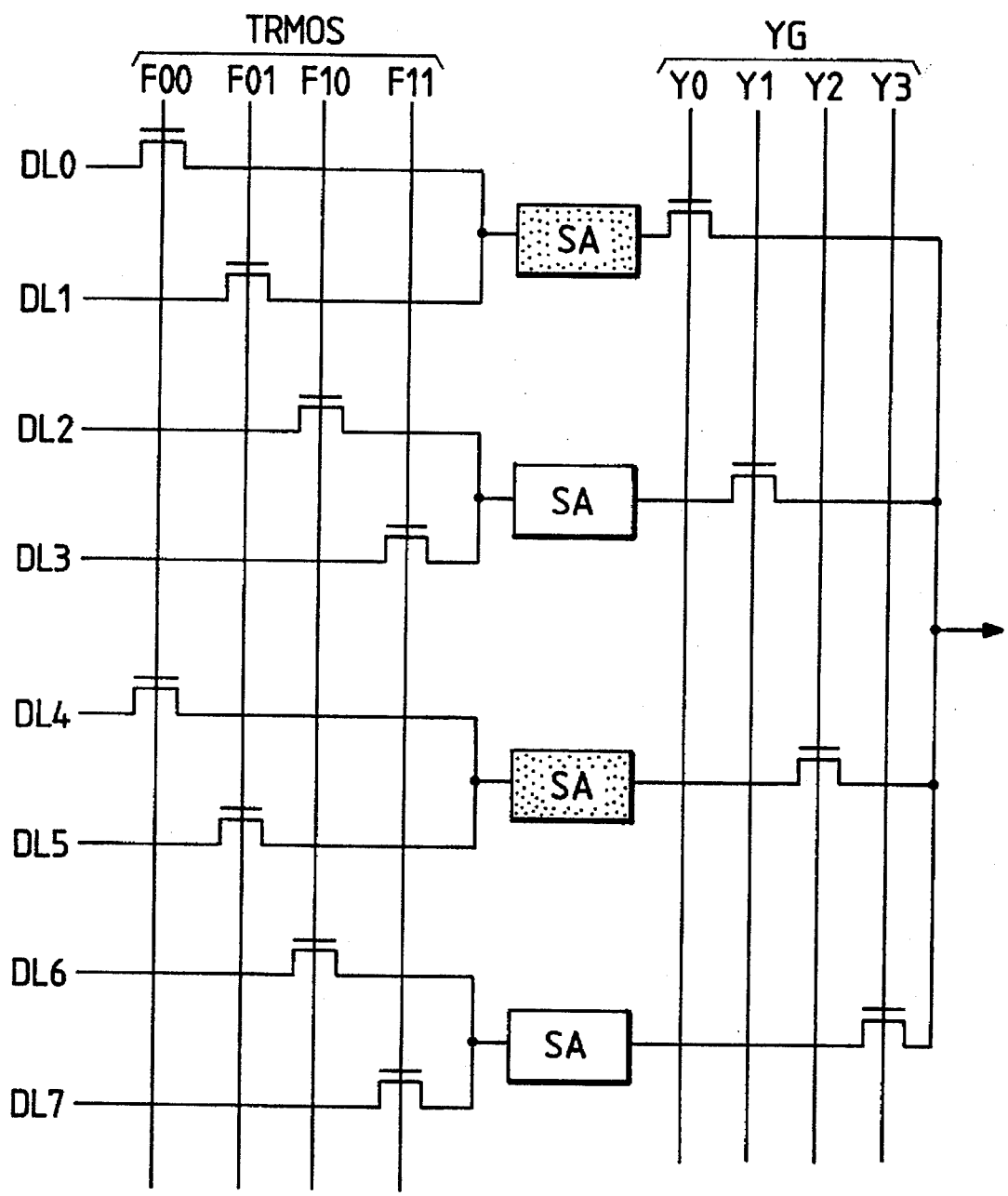
FIG. 25 is still another circuit diagram illustrating the relation between the data lines and sense amplifiers of the semiconductor memory device according to the present invention.

FIG. 25 is still another circuit diagram illustrating the relation between data lines and sense amplifiers according to the present invention. According to this embodiment, two data lines are allotted to one sense amplifier; that is, eight data lines DL0~DL7 in total are allotted to four sense amplifiers with the data lines in pairs. Select signals F00, F01, F11 are also allowed to have a column select function. With the combination of the signals F00~F11, the data lines DL0~DL7 can be made to output their signals continuously without the switching of the word line. There are provided four precharge MOSFETs for the data lines DL0~DL7 corresponding to the transfer MOSFET. Precharge voltages Vr0~Vr3 are supplied to the respective precharge MOSFETs.

When the signals F00, F10 are used to read the four data lines during the continuous read operation, for example, F01, F11 are subsequently used to read the remaining four data lines. The switching of the word line is conducted after the eight data lines are read by F00, F10 and F01, F00 above. With this arrangement, the number of sense amplifiers can be halved with that of data lines.

Figure 26:
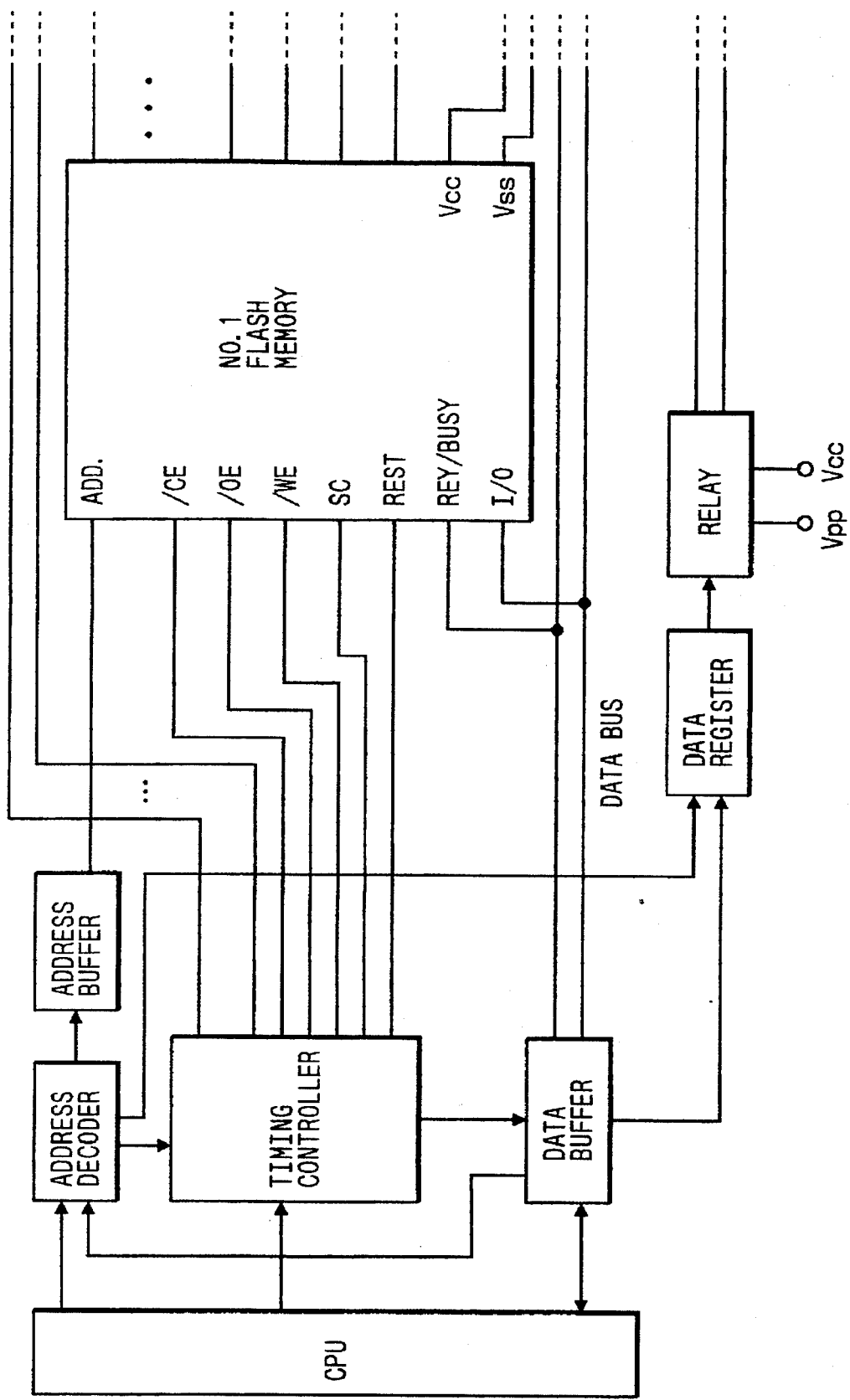
FIG. 26 is a block diagram of a data processing system such as a microcomputer using the semiconductor memory device according to the present invention.

FIG. 26 is a block diagram of a data processing system such as a microcomputer using the semiconductor memory device according to the present invention. A flash memory is formed with the semiconductor memory device as set forth above.

The system according to this embodiment comprises a central processing unit (or microprocessor) CPU, an address decoder, a timing controller, a data buffer, a data register, a relay and the flash memory as mentioned previously. Although one flash memory has been shown by way of example, a plurality of them connected in parallel may be installed to obtain a desired storage capacity. Incidentally, the illustration of memories RAM, ROM and input/output devices essential to the above system such as a microcomputer have been omitted as they are irrelevant to the present invention.

The SC pin of the flash memory functions as a serial clock input terminal. Data is serially output in synchronization with the clock signal SC applied to the input terminal. Although this serial clock signal SC is to be generated by the timing controller, the system clock of CPU may directly be input thereto.

Referring to the serial read from the flash memory, data is output from an I/O pin while the internal address is incremented in synchronization with SC when /CE, /OE remain at the low level. At this time, the address bus is set free. When an output is obtained from a second flash memory (not shown) while the first flash memory is serially operated, it is only necessary to isolate the signal /OE so as prevent data from vying with one another in the data bus.

The effect of the invention is as follows:
(1) A plurality of data lines of a memory array comprising storage transistors arranged in a matrix form as those having a high or low threshold voltage according to stored data are divided into a plurality of blocks, whereas sense amplifiers are used for amplifying signals dispersedly in time, whereby the operating margin of the sense amplifier can be increased as the peak current becomes reducible.
(2) A first and a second group of sense amplifiers respectively corresponding to odd- and even-numbered adjoining data lines are arranged so that while the output signals of one group of sense amplifiers are output, word lines are switched, and the other group of sense amplifiers are caused to perform the operation of amplifying the signals read from the memory cells corresponding to the word lines thus switched, respectively. In this way, the adjoining data-line to data-line coupling noise can be reduced by performing the operation of reading odd- and even-numbered data lines alternately and a continuous serial high-speed read operation can also be carried out effectively.
(3) The address for use in not only reading data from the odd- and even-numbered data lines but also switching the word line is provided by an address generator circuit to be stepped in synchronization with the clock signal supplied from the external terminal, whereby a large amount of data can be read simply at high speed.
(4) The data line is connected via the first select MOSFET to the common drain of the storage MOSFET in the stacked gate structure and the ground potential is connected via the second select MOSFET to the common source thereof, so that the stress at the time of write/erase with respect to the non-select storage MOSFET can be reduced greatly and effectively.
(5) The memory array comprises a pair of memory mats and the data line of each memory mat is input to the differential sense amplifier. With the potential of the data line of the non-select memory mat as a reference voltage, the potential of the data line of the select memory mat is amplified, so that a sensitive, high-speed sense amplifier is obtainable.
(6) The sense amplifier is provided with MOSFET for receiving the amplification signal and wired ORed therewith, whereby a signal for detecting the erase state of the whole data line can effectively be output.
(7) With the use of the sense amplifier as a CMOS latch circuit, write data is input and held and by performing the write operation simultaneously intended for the memory cell corresponding to the data lines on the bases of the data held thereby, a high-speed write operation becomes achievable.

The invention made by the present inventors has been described concretely and it is not limited to the foregoing embodiments but needless to say may be modified in various ways without departing from the scope of the invention. For example, the differential sense amplifier may be used as an amplifier MOSFET as in the case of static RAM. In addition to the flash EEPROM above, the storage MOSFET may be used to form EPROM and mask ROM.

The present invention is broadly applicable to semiconductor memory devices having a high or low threshold voltage, depending on the data received. The semiconductor memory device may be incorporated in a digital integrated circuit such as a 1-chip microcomputer.

A brief description will subsequently be given of the effect of the invention. The data lines of a memory array comprising the storage transistors arranged in a matrix form as those having a high or low threshold voltage according to stored data are divided into a plurality of blocks, and the sense amplifiers for performing amplification operations dispersedly in time are used to amplify signals. The first and second groups of sense amplifiers respectively corresponding to the odd- and even-numbered adjoining data lines are arranged so that while the output signals of one group of sense amplifiers are output, word lines are switched from one to another, the other group of sense amplifiers are caused to perform the operation of amplifying the signals read from the memory cells corresponding to the word lines thus switched, respectively. In this way, the adjoining data-line to data-line coupling noise can be reduced by performing the operation of reading the odd- and even-numbered data lines alternately and the continuous serial high-speed read operation can also be carried out effectively.

What is claimed is:

1. A semiconductor memory device comprising:

a plurality of word lines;

a plurality of data lines;

a plurality of memory cells, wherein each of said plurality of memory cells has a first and a second semiconductor region, a floating gate and a control gate, and wherein the control gate is coupled to one of said plurality of word lines, and wherein the first semiconductor region is coupled to one of said plurality of data lines, a first group of sense amplifiers which correspond to odd-numbered data lines in said plurality of data lines, a second group of sense amplifiers which correspond to even-numbered data lines in said plurality of data lines;

first select switch circuits which couple said first group of sense amplifiers to said odd-numbered data lines in accordance with a first select signal; and second select switch circuits which couple said second group of sense amplifiers to said even-numbered data lines in accordance with a second select signal; and data select circuits which couple said sense amplifiers to said data terminal in accordance with address signals supplied sequentially;

wherein after said first group of sense amplifiers store data on said odd-numbered data lines by coupling said first group of sense amplifiers to said odd-numbered data lines in accordance with said first select signal, said second group of sense amplifiers store data on said even-numbered data lines by coupling said second group of sense amplifiers to said even-numbered data lines in accordance with said second select signal, and wherein said first group and said second group of sense amplifiers output data stored therein sequentially by coupling said sense amplifiers to said data terminal in accordance with address signals.

2. The semiconductor memory device according to claim 1, further comprising shorting MOSFETs which are connected to said odd-numbered data lines and said even-numbered data lines of said plurality of data lines.

3. The semiconductor memory device according to claim 2, wherein said odd-numbered data lines are set to a ground level by said shorting MOSFETs which are connected to said odd-numbered data lines when said odd-numbered data lines are in a non-selective state.

4. The semiconductor memory device according to claim 3, wherein said even-numbered data lines are set to a ground level by said shorting MOSFETs which are connected to said even-numbered data lines when said even-numbered data lines are in a non-selective state.

5. A semiconductor memory device comprising:

a data terminal;

a plurality of word lines;

a plurality of main data lines;

a plurality of sub-data lines;

a plurality of source lines;

a plurality of memory cells, wherein each of the memory cells has a first and a second semiconductor region, a floating gate and a control gate, wherein said control gate is coupled to one of said plurality of word lines, wherein said first semiconductor region of each of said memory cells on the same column is coupled to one of said plurality of sub-data lines and said sub-data lines on the same column are coupled to one of said main data lines through a select MOSFET, respectively, and wherein said second semiconductor region of each of said memory cells on the same column is coupled to one of said plurality of source lines, a first group of sense amplifiers which are provided so as to correspond to odd-numbered data lines in said plurality of main data lines, a second group of sense amplifiers which are provided so as to correspond to even-numbered data lines in said plurality of main data lines, first select switch circuits which couple said first group of sense amplifiers to said odd-numbered main data lines in accordance with a first select signal;

second select switch circuits which couple said second group of sense amplifiers to said even-numbered main data lines in accordance with a second select signal; and data select circuits which couple said sense amplifiers to said data terminal in accordance with address signals supplied sequentially, wherein after said first group of sense amplifiers receive data on said odd-numbered main data lines by coupling said first group of sense amplifiers to said odd-numbered main data lines in accordance with said first select signal, said second group sense amplifiers receive data on said even-numbered main data lines by coupling said second group of sense amplifiers to said even-numbered main data lines in accordance with said second select signal, and wherein said first group and said second group of sense amplifiers output data stored therein sequentially by coupling said sense amplifiers to said data terminal in accordance with address signals.

6. The semiconductor memory device according to claim 5, further comprising shorting MOSFETs which are connected to said odd-numbered main data lines and said even-numbered main data lines of said plurality of main data lines.

7. The semiconductor memory device according to claim 6, wherein said odd-numbered main data lines are set to a ground level by said shorting MOSFETs which are connected to said odd-numbered main data lines when said odd-numbered main data lines are in a non-selective state.

8. The semiconductor memory device according to claim 7, wherein said even-numbered main data lines are set to a ground level by said shorting MOSFETs which are connected to said even-numbered main data lines when said even-numbered main data lines are in a non-selective state.

9. A semiconductor memory device comprising:

a plurality of word lines;

a plurality of data lines;

a data terminal;

a plurality of memory cells, wherein each of said plurality of memory cells has a first and a second semiconductor region, a floating gate and a control gate, wherein the control gate is coupled to one of said plurality of word lines, and wherein the first semiconductor region is coupled to one of said plurality of data lines, a plurality of sense amplifiers each of which is coupled to a pair of said plurality of data lines;

a select switch circuit which couples predetermined first data lines of said pairs of data lines to said plurality of sense amplifiers in accordance with a select signal; and a data select circuit which couples said sense amplifiers to said data terminal in accordance with address signals supplied sequentially, wherein, after said plurality of sense amplifiers amplify data on said predetermined first data lines of said pairs of data lines by coupling said plurality of sense amplifiers to said predetermined first data lines in accordance with said select signal, data amplified by said plurality of sense amplifiers are outputted sequentially by coupling said plurality of sense amplifiers to said data terminal in accordance with said address signals, and wherein, after said amplified data are outputted sequentially from said plurality of sense amplifiers, said plurality of sense amplifiers amplify data on predetermined second data lines of said pairs of data lines by coupling said plurality of sense amplifiers in accordance with said select signal, after which data amplified by said plurality of sense amplifiers are outputted sequentially by coupling said plurality of sense amplifiers to said data terminal in accordance with said address signals.

10. The semiconductor memory device according to claim 9, further comprising a shorting MOSFETs which are connected to said plurality of data lines.

11. The semiconductor memory device according to claim 10, wherein laid first data lines of pairs of data lines are set to a ground level by said shorting MOSFETs connected to said first data lines of said pairs of data lines when said first data lines of said pairs of data lines are in a non-selective state.

12. The semiconductor memory device according to claim 10, wherein the second data lines of said pairs of data lines are set to a ground level by said shorting MOSFETs connected to the second data lines of said pairs of data lines when the second data lines are in a non-selective state.

13. The semiconductor memory device according to claim 9, wherein each of said plurality of sense amplifiers has a latch function for latching data on a data line.

14. The semiconductor memory device according to claim 1, wherein each of said first group and said second group of sense amplifiers has a latch function for latching data on a data line.

15. The semiconductor memory device according to claim 1, further comprising a precharge circuit coupled to said plurality of data lines.

16. The semiconductor memory device according to claim 15, wherein said precharge circuit precharges ones of said odd-numbered and said even numbered data lines.

17. The semiconductor memory device according to claim 16, further comprising a controller which controls said precharge circuit.

18. The semiconductor memory device according to claim 17, wherein said controller controls said precharge circuit so as to precharge said odd-numbered and even-numbered data lines in a different time.

19. The semiconductor memory device according to claim 5, wherein each of said first and said second group of sense amplifiers has a latch function for latching data on a main data line.

20. The semiconductor memory device according to claim 5, further comprising a precharge circuit coupled to said plurality of main data lines.

21. The semiconductor memory device according to claim 20, wherein said precharge circuit precharges ones of said odd-numbered and even-numbered data lines.

22. The semiconductor memory device according to claim 21, further comprising a controller which controls said precharge circuit.

23. The semiconductor memory device according to claim 22, wherein said controller controls said precharge circuit so as to precharge said odd-numbered and said even-numbered data lines in a different time.

24. The semiconductor memory device according to claim 9, wherein each of said plurality of sense amplifiers has a latch function for latching data on a data line.

25. The semiconductor memory device according to claim 9, further comprising a precharge circuit coupled to said plurality of data lines.

26. The semiconductor memory device according to claim 25, wherein said precharge circuit precharges ones of a pair of plurality of data lines.

27. The semiconductor memory device according to claim 26, further comprising a controller which controls said precharge circuit.

28. The semiconductor memory device according to claim 27, wherein said controller controls said precharge circuit so as to precharge a pair of said plurality of data lines in a different time each other.

29. The semiconductor memory device according to claim 11, wherein said plurality of data lines are a plurality of odd-numbered data lines and a plurality of even-numbered data lines, a pair of said plurality of data lines is an odd-numbered data line of said plurality of odd-numbered data lines and an even-numbered said plurality of even-numbered data lines.

30. The semiconductor memory device according to claim 12, wherein said plurality of data lines are a plurality of odd-numbered data lines and a plurality of even-numbered data lines, a pair of said plurality of data lines is an odd-numbered data line of said plurality of odd-numbered data lines and an even-numbered said plurality of even-numbered data lines.

31. The semiconductor memory device according to claim 13, wherein said plurality of data lines are a plurality of odd-numbered data lines and a plurality of even-numbered data lines, a pair of said plurality of data lines is an odd-numbered data line of said plurality of odd-numbered data lines and an even-numbered said plurality of even-numbered data lines.

32. The semiconductor memory device according to claim 24, wherein said plurality of data lines are a plurality of odd-numbered data lines and a plurality of even-numbered data lines, a pair of said plurality of data lines is an odd-numbered data line of said plurality of odd-numbered data lines and an even-numbered said plurality of even-numbered data lines.

33. The semiconductor memory device according to claim 28, wherein said plurality of data lines are a plurality of odd-numbered data lines and a plurality of even-numbered data lines, a pair of said plurality of data lines is an odd-numbered data line of said plurality of odd-numbered data lines and an even-numbered said plurality of even-numbered data lines.

* * * * *